(12) United States Patent
Araumi et al.

(10) Patent No.: US 11,010,004 B2
(45) Date of Patent: May 18, 2021

(54) INPUT ELEMENT AND INPUT DEVICE

(71) Applicants: Mayuka Araumi, Tokyo (JP); Yuko Arizumi, Kanagawa (JP); Makito Nakashima, Kanagawa (JP); Megumi Kitamura, Tokyo (JP); Tomoaki Sugawara, Kanagawa (JP); Tsuneaki Kondoh, Kanagawa (JP); Takahiro Imai, Tokyo (JP); Junichiro Natori, Kanagawa (JP); Hideyuki Miyazawa, Kanagawa (JP); Mizuki Otagiri, Kanagawa (JP)

(72) Inventors: Mayuka Araumi, Tokyo (JP); Yuko Arizumi, Kanagawa (JP); Makito Nakashima, Kanagawa (JP); Megumi Kitamura, Tokyo (JP); Tomoaki Sugawara, Kanagawa (JP); Tsuneaki Kondoh, Kanagawa (JP); Takahiro Imai, Tokyo (JP); Junichiro Natori, Kanagawa (JP); Hideyuki Miyazawa, Kanagawa (JP); Mizuki Otagiri, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 16/083,722

(22) PCT Filed: Jan. 16, 2017

(86) PCT No.: PCT/JP2017/001251
§ 371 (c)(1),
(2) Date: Sep. 10, 2018

(87) PCT Pub. No.: WO2017/159023
PCT Pub. Date: Sep. 21, 2017

(65) Prior Publication Data
US 2019/0089353 A1 Mar. 21, 2019

(30) Foreign Application Priority Data

Mar. 14, 2016 (JP) .............................. JP2016-049588
Dec. 20, 2016 (JP) .............................. JP2016-246273

(51) Int. Cl.
*G06F 3/041* (2006.01)
*G06F 3/044* (2006.01)
(Continued)

(52) U.S. Cl.
CPC .......... *G06F 3/0445* (2019.05); *G06F 3/0446* (2019.05); *G06F 3/04144* (2019.05);
(Continued)

(58) Field of Classification Search
CPC ..... H03K 17/975; G06F 3/0414; G06F 3/044; G06F 2203/04103; H01L 41/1132
See application file for complete search history.

(56) References Cited

U.S. PATENT DOCUMENTS 5,616,646 A * 4/1997 Kendall ............. B01D 19/0409
204/157.62
10,248,241 B2 * 4/2019 Kondoh ................ G06F 3/0414
(Continued)

FOREIGN PATENT DOCUMENTS

CN 1650377 A 8/2005
CN 101925793 A 12/2010
(Continued)

OTHER PUBLICATIONS

International Search Report dated Apr. 4, 2017 in PCT/JP2017/001251 filed on Jan. 16, 2017.
(Continued)

*Primary Examiner* — Lixi C Simpson
(74) *Attorney, Agent, or Firm* — Oblon, McClelland, Maier & Neustadt, L.L.P.

(57) ABSTRACT

An input element includes: a first electrode and a second electrode that face each other; and an intermediate layer
(Continued)

disposed between the first and the second electrodes and made of rubber or a rubber composition, the rubber or rubber composition containing siloxane. The intermediate layer is made of rubber or a rubber composition, the rubber or rubber composition containing siloxane that has a silicon atom bound to three to four oxygen atoms. The intermediate layer has concentration profiles such that, while oxygen increases from one side to the other side of a thickness direction thereof and has a maximal value, carbon decreases from the one side to the other side thereof and has a minimal value.

14 Claims, 18 Drawing Sheets

(51) Int. Cl.
  *H03K 17/975* (2006.01)
  *H03K 17/96* (2006.01)
  *H01L 41/113* (2006.01)
  *H01L 41/193* (2006.01)
  *H01L 41/253* (2013.01)

(52) U.S. Cl.
  CPC ........ *H01L 41/1132* (2013.01); *H01L 41/193* (2013.01); *H03K 17/962* (2013.01); *H03K 17/975* (2013.01); *G06F 2203/04103* (2013.01); *H01L 41/253* (2013.01); *H03K 2017/9613* (2013.01)

(56) References Cited

U.S. PATENT DOCUMENTS

| | | | |
|---|---|---|---|
| 2003/0205450 A1 | 11/2003 | Divigalpitiya et al. | |
| 2005/0099401 A1 | 5/2005 | Matsumoto et al. | |
| 2010/0288635 A1 | 11/2010 | Komiya et al. | |
| 2011/0183526 A1* | 7/2011 | Yamamoto | C23C 16/401 |
| | | | 438/778 |
| 2013/0236730 A1 | 9/2013 | Böse et al. | |
| 2013/0322942 A1* | 12/2013 | Kondoh | G03G 15/2057 |
| | | | 399/333 |
| 2014/0049137 A1 | 2/2014 | Ando et al. | |
| 2014/0375912 A1 | 12/2014 | Gotoh et al. | |
| 2015/0292964 A1 | 10/2015 | Sibbett | |
| 2015/0318074 A1 | 11/2015 | Skov et al. | |
| 2015/0355771 A1 | 12/2015 | Watazu et al. | |
| 2015/0370284 A1* | 12/2015 | Bauer | G06F 3/041 |
| | | | 345/174 |
| 2016/0276957 A1 | 9/2016 | Sugawara et al. | |
| 2016/0328066 A1 | 11/2016 | Kondoh et al. | |
| 2016/0336505 A1 | 11/2016 | Arizumi et al. | |
| 2016/0341381 A1 | 11/2016 | Imai et al. | |
| 2016/0344309 A1 | 11/2016 | Otagiri et al. | |
| 2016/0378223 A1* | 12/2016 | Hyuga | G06F 3/044 |
| | | | 345/174 |
| 2017/0186939 A1 | 6/2017 | Ando et al. | |
| 2017/0324023 A1 | 11/2017 | Kondoh et al. | |

FOREIGN PATENT DOCUMENTS

| | | |
|---|---|---|
| CN | 104246607 A | 12/2014 |
| JP | 4784041 B2 | 7/2011 |
| JP | 2011-155077 A | 8/2011 |
| JP | 2011-170511 A | 9/2011 |
| JP | 2014-27756 A | 2/2014 |
| JP | 2014-186711 A | 10/2014 |
| JP | 2015-57822 A | 3/2015 |
| JP | 2015-97068 A | 5/2015 |
| JP | 2016-103967 A | 6/2016 |
| KR | 10-2012-0129965 | 11/2012 |
| TW | 201431966 A | 8/2014 |
| WO | WO 2009/096419 A1 | 8/2009 |
| WO | WO 2014/017184 A1 | 1/2014 |
| WO | WO 2014/105970 A1 | 7/2014 |
| WO | 2015/093030 A1 | 6/2015 |

OTHER PUBLICATIONS

Extended European Search Report dated Feb. 19, 2019 in European Patent Application No. 17766031.3, 6 pages.
Korean Office Action issued in Korean Patent Application No. 10-2018-7026434 dated Dec. 19, 2019.
Notice of Allowance of Patent dated Jun. 12, 2020 in Korean Patent Application No. 10-2018-7026434 (with English language translation), 7 pages.
Chinese Office Action dated Nov. 3, 2020 with English translation issued in corresponding Chinese Application No. 201780016603.2, (20 pages).

* cited by examiner

INPUT ELEMENT AND INPUT DEVICE

FIELD

The present invention relates to an input element and an input device.

BACKGROUND

Known input elements for inputting to an electronic apparatus such as a personal computer, a tablet display device, or a smartphone include an input element that detects a position with touch (contact) made by a finger, a pen, or the like.

For example, a technique (for example, Patent Literature 1) has been proposed that employs a base material formed of polyvinylidene fluoride (PVDF) and interposed between a pair of conductive layers and thereby detects a position and a pressing force by detecting current generated from a position to which a force is applied.

SUMMARY

Technical Problem

In an input element employing PVDF, however, a pressing operation needs to be performed with sufficiently large force in order to generate voltage with a piezoelectric effect of PVDF. For this reason, such an input element does not provide light operability when being operated by a finger, and often causes inconvenience from, for example, the necessity of performing what is called a twice-pressing operation.

The present invention has been made in view of such inconvenience and an objective thereof is to provide an input element that allows for reliable input with light operability.

Solution to Problem

Advantageous Effects of Invention

According to the present invention, an input element that allows for reliable input with light operability can be provided.

DESCRIPTION OF EMBODIMENTS

The following describes embodiments of the present invention with reference to the drawings. FIG. 1 to FIG. 6 illustrate a first embodiment.

Overview

Figure 1:
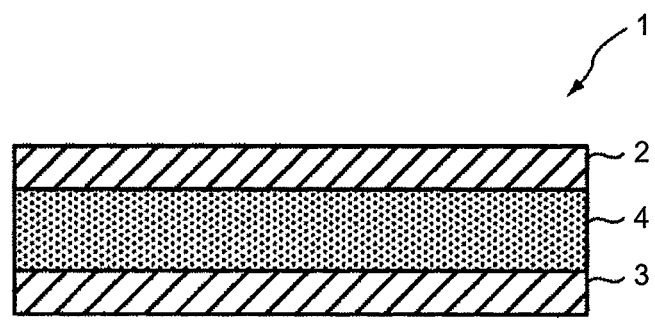
FIG. 1 is a schematic sectional view illustrating the configuration of an input element according to a first embodiment of the present invention.

FIG. 1 is a schematic sectional view illustrating the configuration of an input element in this embodiment. An input element 1 includes: a first electrode 2 and a second electrode 3 facing each other; and an intermediate layer 4 disposed between the first and the second electrodes 2 and 3 and made of rubber or a rubber composition, the rubber or the rubber composition containing siloxane.

Details

First Electrode and Second Electrode

The first electrode 2 and the second electrode 3 are not particularly limited to specific configurations, and any desirable configurations may be selected as appropriate in accordance with the purpose. However, configurations that can deform in response to a touch are preferable in particular.

Examples of materials for the first electrode 2 and the second electrode 3 include metal, a carbon-based conductive material, a conductive rubber composition, conductive polymer, and oxide.

Examples of the metal include gold, silver, copper, aluminum, stainless steel, tantalum, nickel, and phosphor bronze. Examples of the carbon-based conductive material include carbon nanotube, carbonaceous fiber, and graphite. Examples of the conductive rubber composition include a composition containing conductive filler and rubber. Examples of the conductive polymer include polyethylene dioxythiophene (PEDOT), polypyrrole, and polyaniline. Examples of the oxide include indium tin oxide (ITO), indium oxide-zinc oxide (IZO), and zinc oxide.

Examples of the conductive filler include a carbon material (for example, Ketjenblack, acetylene black, graphite, carbonaceous fiber, carbon fiber (CF), carbon nanofiber (CNF), carbon nanotube (CNT), or graphene), metal filler (such as gold, silver, platinum, copper, aluminum, or nickel), a conductive polymer material (a derivative of any one of polythiophene, polyacetylene, polyaniline, polypyrrole, polyparaphenylene, and polyparaphenylene vinylene, or a material obtained by adding a dopant, the representative examples of which include anion and cation, to the derivative), and an ionic solution. One of these materials may be used alone, or two or more thereof may be used in combination.

Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. One of these materials may be used alone, or two or more thereof may be used in combination.

For the element that needs to be transparent, it is preferable that transparent electrodes each made of ITO, IZO, zinc oxide, or PEDOT be selected.

The first electrode 2 and the second electrode 3 may be made of the same material or may be made of different materials.

The first electrode 2 and the second electrode 3 may be formed in the same pattern or may be formed in different patterns. For the electrode that is divided, it is preferable that a plurality of patterns such as linear patterns, grid-like patterns, or diamond-like patterns be arranged (see FIGS. 7 to 9 in Patent Literature 2).

A preferable arrangement of the electrodes includes a plurality of linear patterns extending in one direction within one plane in each of the electrodes with the direction of the patterns of the first electrode not being parallel to the direction of the patterns of the second electrode. It is particularly preferable that these directions are perpendicular to each other.

The width of each of the linear patterns is preferably 0.5 mm to 20 mm, more preferably 1 mm to 10 mm, in view of practical implementation. The width thereof narrower than 1 mm causes two or more electrodes to react even to input made with a fine item such as a pen tip, which increases unnecessary signal processing.

In contrast, the width thereof larger than 10 mm makes it difficult to smoothly follow input made with touch or movement of a fingertip, which decreases accuracy in position of the input.

Applicable methods for forming each of the first electrode 2 and the second electrode 3 include vapor deposition, sputtering, plating, foil bonding, screen printing, and blade coating.

The average thickness of each of the first and the second electrodes 2 and 3 is not particularly limited and may be selected as appropriate in accordance with the purpose. However, the average thickness thereof is preferably 0.01 μm to 200 μm, more preferably 0.1 μm to 50 μm, in view of conductivity and deformation followability. When the average thickness is larger than or equal to 0.01 μm, adequate mechanical strength is secured, and higher conductivity is obtained. When the average thickness is smaller than or equal to 200 μm, the element is deformable, it is thus made possible to highly sensitively and highly accurately detect at least one of: information on a position at which an operation with pressing force has been performed; and information on the pressing force.

Intermediate Layer

The intermediate layer 4 preferably has flexibility.

The intermediate layer 4 preferably satisfies at least one of the following condition (1) and condition (2).

Condition (1): One part (one side) of the intermediate layer 4 that faces the first electrode 2 and the other part (the other side) of the intermediate layer 4 that faces the second electrode 3 have different deformation amounts when force is applied to the intermediate layer 4 from a direction perpendicular to the plane of the intermediate layer 4.

Condition (2): The universal hardness (H1) with an indentation depth of 10 μm in the one part of the intermediate layer 4 that faces the first electrode 2 is different from the universal hardness (H2) with an indentation depth of 10 μm in the other part of the intermediate layer 4 that faces the second electrode 3.

A large electric signal can be obtained in the intermediate layer 4 because the respective opposite sides thereof thus have different deformation amounts or different levels of hardness. As used herein, an electric signal refers to a voltage or current.

In the present invention, a deformation amount refers to the maximum indentation depth of an indenter when the indenter is pushed against the intermediate layer 4 under the following conditions.

Measurement Conditions

Measuring Instrument: Microhardness tester WIN-HUD manufactured by Fischer Indenter: A square-pyramid diamond indenter having face angles of 136 degrees Initial load: 0.02 mN Maximum load: 1 mN Time for load increase from initial to maximum load: 10 seconds A universal hardness can be found on the following manner.

Measurement Conditions

Measuring Instrument: Microhardness tester WIN-HUD manufactured by Fischer

Indenter: a square-pyramid diamond indenter having face angles of 136 degrees

Indentation depth: 10 μm

Initial load: 0.02 mN

Maximum load: 100 mN

Time for load increase from initial to maximum: 50 seconds

The ratio (H1/H2) of the universal hardness (H1) to the universal hardness (H2) is preferably 1.01 or higher, more preferably 1.07 or higher, particularly preferably 1.13 or higher. The upper value of the ratio (H1/H2) is not particularly limited and may be selected as appropriate on the basis of such factors as the degree of flexibility demanded for a corresponding usage state and a load imposed in a corresponding usage state. However, the upper value thereof is preferably 1.70 or less. Here, H1 is a universal hardness of a relatively hard surface, while H2 is a universal hardness of a relatively soft surface.

A material for the intermediate layer 4 is not particularly limited and may be selected as appropriate in accordance with the purpose, and examples of the material include rubber and a rubber composition. Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. One of these materials may be used alone, or two or more thereof may be used in combination. Among these materials, silicone rubber is preferable because a large electric signal can be obtained therefrom. Silicone rubber is preferable also because the detection sensitivity is unlikely to decrease even when the rubber is exposed to a high temperature.

The silicone rubber is not particularly limited except that it has having siloxane bonds. The silicone rubber may be selected as appropriate in accordance with the purpose. Examples of the silicone rubber include dimethyl silicone rubber, methylphenyl silicone rubber, fluorosilicone rubber, modified silicone rubber (obtained by, for example, acrylic modification, alkyd modification, ester modification, or epoxy modification). One of these materials may be used alone, or two or more thereof may be used in combination.

Examples of the rubber composition include a composition containing filler and rubber. Among such examples, a silicone rubber composition containing silicone rubber is preferable because a large electric signal can be obtained therefrom. The silicone rubber composition is preferable also because the detection sensitivity is unlikely to decrease even when the composition is exposed to a high temperature.

Examples of filler include organic filler, inorganic filler, and organic-inorganic composite filler. The organic filler is not particularly limited except that it is made from an organic compound. The organic filler may be selected as appropriate in accordance with the purpose. Examples of the organic filler include acrylic fine particles, polystyrene fine particles, melamine fine particles, fluororesin fine particles of polytetrafluoroethylene, silicone powder (silicone resin powder, silicone rubber powder, or silicone composite powder), rubber powder, wood powder, pulp, and starch. The inorganic filler is not particularly limited except that it is made from an inorganic compound. The inorganic filler may be selected as appropriate in accordance with the purpose.

Examples of the inorganic filler include oxide, hydroxide, carbonate, sulfate, silicate, nitride, carbon, metal, and other compounds.

Examples of the oxide include silica, diatom earth, alumina, zinc oxide, titanium oxide, iron oxide, and magnesium oxide.

Examples of the hydroxide include aluminum hydroxide, calcium hydroxide, and magnesium hydroxide.

Examples of the carbonate include calcium carbonate, magnesium carbonate, barium carbonate, and hydrotalcite.

Examples of the sulfate include aluminum sulfate, calcium sulfate, and barium sulfate.

Examples of the silicate include calcium silicate (wollastonite or xonotlite), zirconium silicate, kaolin, talc, mica, zeolite, pearlite, bentonite, montmorillonite, sericite, activated while earth, glass, and hollow glass beads.

Examples of the nitride include aluminum nitride, silicon nitride, and boron nitride.

Examples of the carbon include Ketjenblack, acetylene black, graphite, carbonaceous fiber, carbon fiber, carbon nanofiber, carbon nanotube, fullerene (or a derivative thereof), and graphene.

Examples of the metal include gold, silver, platinum, copper, iron, aluminum, and nickel.

Examples of the other compound include potassium titanate, barium titanate, strontium titanate, lead zirconate titanate, silicon carbide, and molybdenum sulfide. The inorganic filler may have a surface treatment applied thereto.

The organic-inorganic composite filler that may be used is not particularly limited except that it is a compound obtained by combining an organic compound and an inorganic compound at the molecular level.

Examples of the organic-inorganic composite filler include silica-acryl composite fine particles and silsesquioxane.

The average particle diameter of the filler is not particularly limited and may be selected as appropriate in accordance with the purpose. However, the average particle diameter thereof is preferably 0.01 km to 30 km, more preferably 0.1 μm to 10 μm. When the average particle diameter is 0.01 km or larger, the likelihood of having a large electric signal is higher than otherwise. When the average particle diameter is 30 μm, the intermediate layer 4 is deformable, and it is thus made possible to highly sensitively and highly accurately detect at least one of: information on a position at which an operation with pressing force has been performed; and information on the pressing force.

The average particle diameter can be measured in accordance with a publicly known method and using a publicly known granularity distribution measuring instrument such as Microtrack HRA (manufactured by Nikkiso Co., Ltd).

The amount of the filler relative to 100 parts by mass of the rubber is preferably 0.1 parts by mass to 100 parts by mass, more preferably 1 part by mass to 50 parts by mass. When the amount of the filler is 0.1 parts by mass or larger, the likelihood of having a large electric signal is higher than otherwise. When the amount of the filler is 100 parts by mass or smaller, the intermediate layer 4 is deformable, and it is thus made possible to highly sensitively and highly accurately detect at least one of: information on a position at which an operation with pressing force has been performed; and information on the pressing force.

The other component is not particularly limited and may be selected as appropriate in accordance with the purpose, and examples thereof include an additive. The amount of the other component may be selected as appropriate to the extent such that the object of the present invention is not impaired.

Examples of the additive include a cross-linker, a reaction controller, a bulking agent, a stiffener, an age inhibitor, a conductivity controller, a colorant, a plasticizer, a processing aid, an ultraviolet absorber, a tackifier, and a thixotropy-imparting agent.

A method for preparing a material for the intermediate layer 4 is not particularly limited and may be selected as appropriate in accordance with the purpose. For example, an applicable method for preparing the rubber composition is to mix together rubber, filler, and the other component if needed and knead and disperse the mixture.

A method for forming the intermediate layer 4 is not particularly limited and may be selected as appropriate in accordance with the purpose. For example, an applicable method for forming a thin film of the rubber composition is to apply the rubber composition on a base by blade coating, die coating, and dip coating and harden the rubber composition with heat or an electron beam.

The average thickness of the intermediate layer 4 is not particularly limited and may be selected as appropriate in accordance with the purpose. However, the average thickness thereof is preferably 1 µm to 500 µm, more preferably 20 µm to 200 µm, in view of deformation followability. When the average thickness is within the preferable range, film formability is secured, and deformation is undisturbed. It is thus made possible to highly sensitively and highly accurately detect at least one of: information on a position at which an operation with pressing force has been performed; and information on the pressing force.

The intermediate layer 4 is preferably insulative. The intermediate layer 4 is preferably as insulative as having the volume resistivity thereof is $10^8$ Ωcm or higher, more preferably as insulative as having a volume resistivity of $10^{10}$ Ωcm or higher. The intermediate layer 4 may have a multilayer structure.

(Surface Modification Treatment and Deactivation Treatment)

Examples of a method of making the deformation amounts or the hardness levels between the opposite sides in the intermediate layer 4 include a surface modification treatment and a deactivation treatment. One or both of these treatments may be applied.

<Surface Modification Treatment>

Examples of the surface modification treatment include a plasma treatment, a corona discharge treatment, an electron beam irradiation treatment, an ultraviolet irradiation treatment, an ozone treatment, and a radiation (X-ray, alpha-ray, beta-ray, gamma-ray, or neutron) irradiation treatment. Although the plasma treatment, the corona discharge treatment, and the electron beam irradiation treatment are more preferable than the others among the above listed treatments in terms of treatment speeds, the surface modification treatment is not limited to these treatments when being one that can modify a material with an adequately large irradiation energy.

Plasma Treatment

In the case of the plasma treatment, examples of the plasma generator include a parallel plate type generator, a capacitance coupling type generator, and an inductive coupling type generator, and an atmospheric-pressure plasma generator is also applicable. A low-pressure plasma treatment is preferable for durability.

The reaction pressure for the plasma treatment is not particularly limited and may be selected as appropriate in accordance with the purpose. However, the reaction pressure is preferably 0.05 Pa to 100 Pa, more preferably 1 Pa to 20 Pa.

A reaction atmosphere for the plasma treatment is not particularly limited and may be selected as appropriate in accordance with the purpose, and effective examples thereof include gas, such as inert gas, noble gas, and oxygen. However, the reaction atmosphere is preferably argon in view of continuity of an effect.

The oxygen partial pressure of the reaction atmosphere is then preferably set to 5,000 ppm or lower. When the oxygen partial pressure of the reaction atmosphere is 5,000 ppm or lower, generation of ozone can be suppressed, and use of an ozone treatment device can be avoided.

The irradiation power amount in the plasma treatment is defined by "output×irradiation time". The irradiation power amount is preferably 5 Wh to 200 Wh, more preferably 10 Wh to 50 Wh. When the irradiation power amount is within the preferable range, the intermediate layer 4 can be provided with the capability of generating an electric signal, and excessive irradiation that results in durability decrease can be prevented.

Corona Discharge Treatment

The applied energy (cumulative energy) in the corona discharge treatment is preferably 6 J/cm$^2$ to 300 J/cm$^2$, and more preferably 12 J/cm$^2$ to 60 J/cm$^2$. When the applied energy is within the preferable range, the intermediate layer 4 can be provided with the capability of generating an electric signal, and excessive irradiation that results in durability decrease can be prevented.

Electron Beam Irradiation Treatment

The irradiation in the electron beam irradiation treatment is preferably 1 kGy or larger, more preferably 300 kGy to 10 MGy. When the irradiation amount is within the preferable range, the intermediate layer 4 can be provided with the capability of generating an electric signal, and excessive irradiation that results in durability decrease can be prevented.

A reaction atmosphere for the electron beam irradiation treatment is not particularly limited and may be selected as appropriate in accordance with the purpose. However, it is preferable that the reaction atmosphere be filled with an inert gas such as argon, neon, helium, or nitrogen and have an oxygen partial pressure of 5,000 ppm or lower. When the oxygen partial pressure of the reaction atmosphere is 5,000 ppm or lower, generation of ozone can be suppressed, and use of an ozone treatment device can be avoided.

Ultraviolet Irradiation Treatment

Ultraviolet for the ultraviolet irradiation treatment preferably has a wavelength of 365 nm or lower and 200 nm or higher, more preferably has a wavelength of 320 nm or lower to 240 nm or higher.

The cumulative light quantity in the ultraviolet irradiation treatment is preferably 5 J/cm² to 500 J/cm², and more preferably 50 J/cm² to 400 J/cm². When the cumulative light quantity is within the preferable range, the intermediate layer 4 can be provided with the capability of generating an electric signal, and excessive irradiation that results in durability decrease can be prevented.

A reaction atmosphere for the ultraviolet irradiation treatment is not particularly limited and may be selected as appropriate in accordance with the purpose. However, it is preferable that the reaction atmosphere be filled with an inert gas such as argon, neon, helium, or nitrogen and have an oxygen partial pressure of 5,000 ppm or lower. When the oxygen partial pressure of the reaction atmosphere is 5,000 ppm or lower, generation of ozone can be suppressed, and use of an ozone treatment device can be avoided.

There is a conventional technique that has been proposed to strengthen adhesion between layers by forming active groups through excitation or oxidization caused by plasma treatment, corona discharge treatment, ultraviolet irradiation treatment, electron beam irradiation treatment, or the like. However, the application range of the technique is limited to adhesion between layers because it is known that application thereof to the outermost surface rather deteriorates releasability. In addition, the technique includes causing a reaction under an oxygen-rich condition to effectively introduce a reactive active group (hydroxyl group). For these reasons, such a conventional technique is essentially different from the surface modification treatment as applied in the present invention.

The surface modification treatment as applied in the present invention is a treatment (for example, a plasma treatment) that is applied in a deoxygenated and depressurized reaction environment, and therefore facilitates re-crosslinking and binding in a surface, thereby improving durability, for example, due to "increase in number of Si—O bonds of high binding energy".

In addition, it is considered that releasability is improved due to "densification by increased crosslink density". Note that, while some active groups are formed also in the present invention, the active groups are deactivated by a coupling agent or through an air-drying treatment described below.

<Deactivation Treatment>

A deactivation treatment using various materials may be applied to a surface of the intermediate layer 4 as appropriate.

The deactivation treatment is not particularly limited except that it is a treatment for deactivating a surface of the intermediate layer 4. The treatment may be selected as appropriate in accordance with the purpose, and examples thereof include a treatment that applies a deactivator to a surface of the intermediate layer 4. Deactivation means to change the property of a surface of the intermediate layer 4 so that the surface may be less susceptible to a chemical reaction. This change is achieved by decreasing the degree of activity of the surface of the intermediate layer 4 by causing active groups (for example, "—OH" groups) generated through excitation or oxidization caused by plasma treatment, corona discharge treatment, ultraviolet irradiation treatment, electron beam irradiation treatment, or the like to react with a deactivator.

Examples of the deactivator include an amorphous resin and a coupling agent. Examples of the amorphous resin includes a resin that has a perfluoropolyether structure in the backbone.

Examples of the coupling agent includes metallic alkoxide and a solution that contains metallic alkoxide.

Examples of the metallic alkoxide include a compound expressed by General Formula (1) given below, any of partially hydrolyzed polycondensates of such compounds, and a mixture of such compounds, the partially hydrolyzed polycondensates each having the degrees of polymerization of about 2 to 10.

$$R^1_{(4-n)}Si(OR^2)_n \qquad \text{General Formula (1)}$$

In General Formula (1), $R^1$ and $R^2$ independently each represent a straight-chained or branched alkyl group of a carbon number 1 to 10, an alkyl polyether chain, and an aryl group while n denotes an integer of 2 to 4.

Deactivation treatment can be applied, for example, in a manner such that, after the application of a surface modification treatment to the precursor of the intermediate layer made of rubber or the like, the precursor of the intermediate layer is impregnated with a deactivator by being coated with or dipped into the deactivator.

When silicone rubber is used for the precursor the intermediate layer, the precursor may be deactivated by being left to stand in the air and air-dried after the application of the surface modification treatment.

The profile of oxygen concentrations in the intermediate layer 4 in the thickness direction thereof preferably has a maximal value. The profile of carbon concentrations in the intermediate layer 4 in the thickness direction thereof preferably has a minimal value.

In the intermediate layer 4, a position at which the profile of oxygen concentrations indicates the maximal value and a position at which the profile of carbon concentrations indicates the minimal value are preferably the same.

The profile of oxygen concentrations and the profile of carbon concentrations can be obtained by the XPS.

Examples of a measurement method therefor include the following method.

{Measurement Method}

Measurement device: Ulvac-PHI QuanteraSXM manufactured by ULVAC-PHI, Inc.

Measurement light source: Al (mono) Measurement output: 100 μmφ and 25.1 W

Measurement area: 500 μm×300 μm

Path energy: 55 eV (narrow scan)

Energy step: 0.1 eV (narrow scan)

Relative sensitivity factors: Relative sensitivity factors from PHI

Sputtering source: C60 cluster ion

Ion gun output: 10 kV, 10 nA

Raster control: (X=0.5, Y=2.0) mm

Sputtering rate: 0.9 nm/min (converted in terms of $SiO_2$)

In the XPS, the ratio of atomic concentrations present in a measured sample and the bonding state of atoms can be found by capturing electrons released by the photoelectronic effect.

Figure 2:
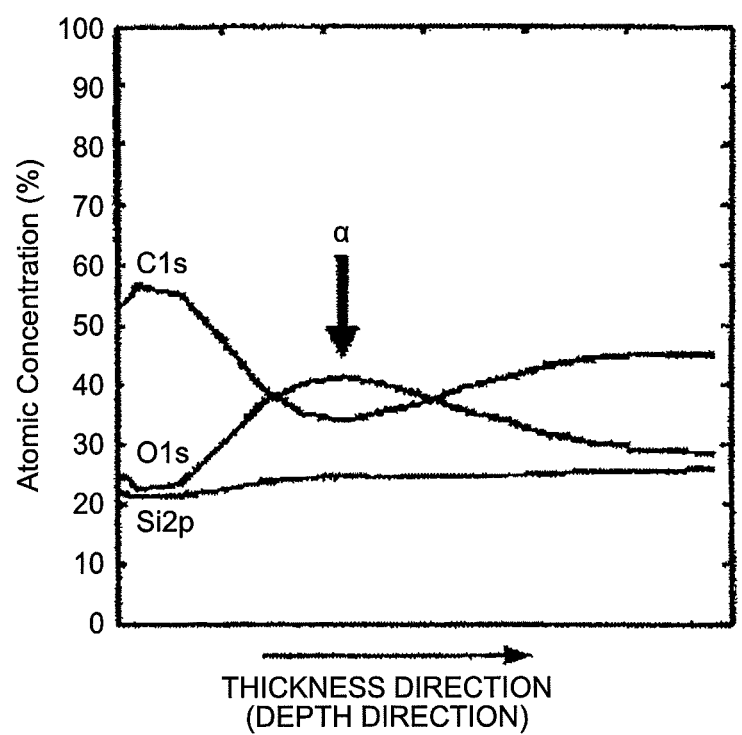
FIG. 2 is a characteristic chart representing the result of X-ray photoelectron spectroscopy (XPS) measurement of an intermediate layer (made of silicone rubber) to which a surface modification treatment and a deactivation treatment have been applied.

Silicone rubber has siloxane bonds and contains silicon (Si), oxygen (O), and carbon (C) as main elements. Therefore, when silicone rubber is used as a material for the intermediate layer 4, wide-scan spectra of the XPS can be measured and, based on the ratios of the relative peak intensities of the respective elements, the atomic concentrations of respective elements can be obtained along the depth direction for atoms found in an inward direction from the surface layer. An example thereof is illustrated in FIG. 2. In this example, the elements are Si, 0, and C, and the respective atomic concentrations are expressed in atomic %.

FIG. 2 pertains to a sample of the intermediate layer 4 that was obtained by using silicone rubber and applying the surface modification treatment (plasma treatment) and the deactivation treatment thereto. In FIG. 2, the horizontal axis indicates depths at which the analysis was made, which were distributed in a direction toward the inside from a surface, and the vertical axis indicates atomic concentrations.

Furthermore, in the case of silicone rubber, the measurement of energy at which an electron in the $2p$ orbital of Si is released can provide knowledge on what the element bound to silicon is and on the state in which the element is bound thereto. For this reason, the chemical binding state was determined by peak separation from a narrow scan spectrum in the Si2p orbital, which indicates the binding state of Si.

Figure 3:
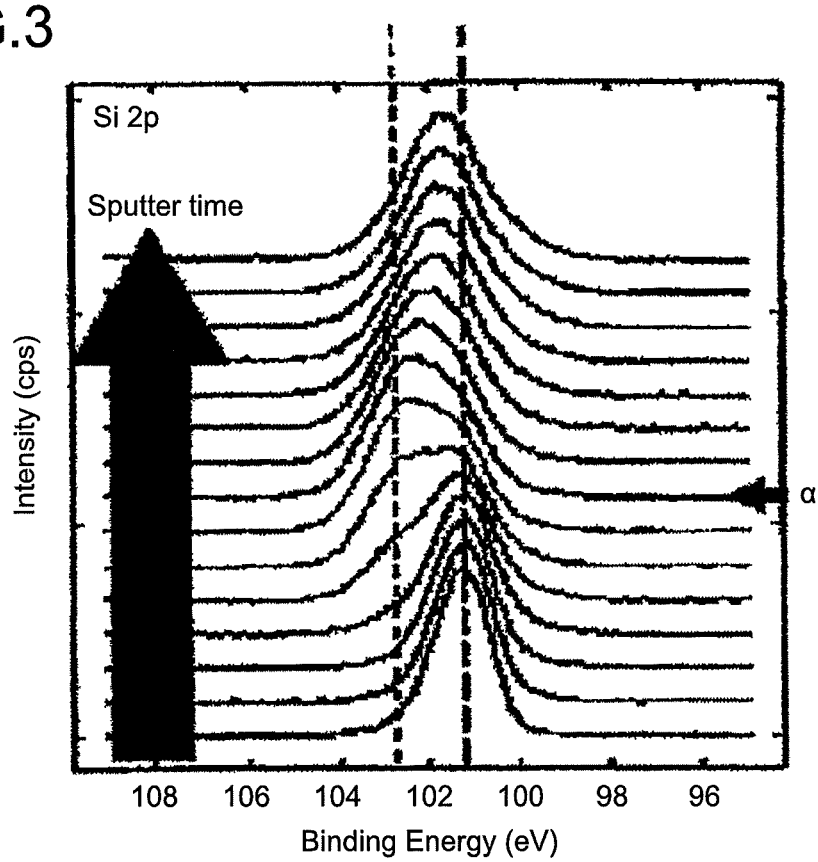
FIG. 3 is a graph representing how the Si2p binding energy in the measurement in FIG. 2 changes in the thickness direction of the intermediate layer.

FIG. 3 illustrates the result. A sample used for measurement in FIG. 3 was the one used for measurement in FIG. 2. In FIG. 3, the horizontal axis indicates binding energy and the vertical axis indicates intensity ratios. Measured spectra at different depths are depicted therein with the spectrum at a deeper depth depicted at an upper position.

It is generally known that the amount of a peak shift depends on a binding state. In the present case of the silicone rubber, shifting of the peak to the higher energy side in the Si2p orbital means that the number of oxygen atoms bound to Si increased.

This suggests that the application of the surface modification treatment and the deactivation treatment to the silicone rubber causes oxygen to increase in an inward direction from the surface layer to have a maximal value and causes carbon to decrease in the same direction to have a minimal value. The analysis at deeper positions reveals that oxygen decreases while carbon increases and that the same atomic concentrations thereof as those in almost untreated silicone rubber appear.

Furthermore, the maximal value detected at a position of α in FIG. 2 coincides with shifting of a Si2p binding energy shift toward higher energy (at a position of a in FIG. 3), which indicates that the increase of oxygen is attributable to the number of oxygen atoms bound to Si.

Figure 4:
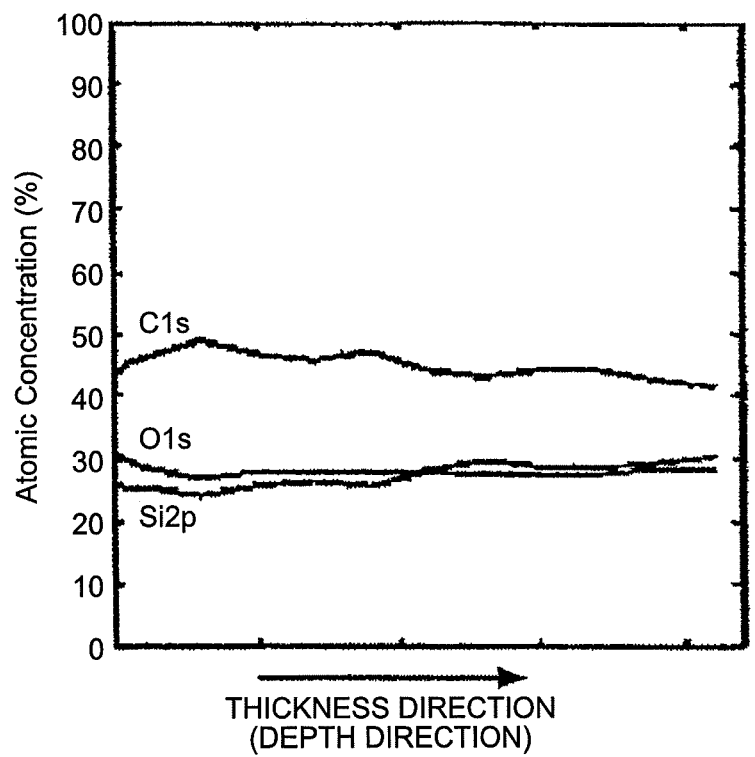
FIG. 4 is a characteristic chart representing the result of XPS measurement of an intermediate layer (silicone rubber) to which no treatment has been applied.
Figure 5:
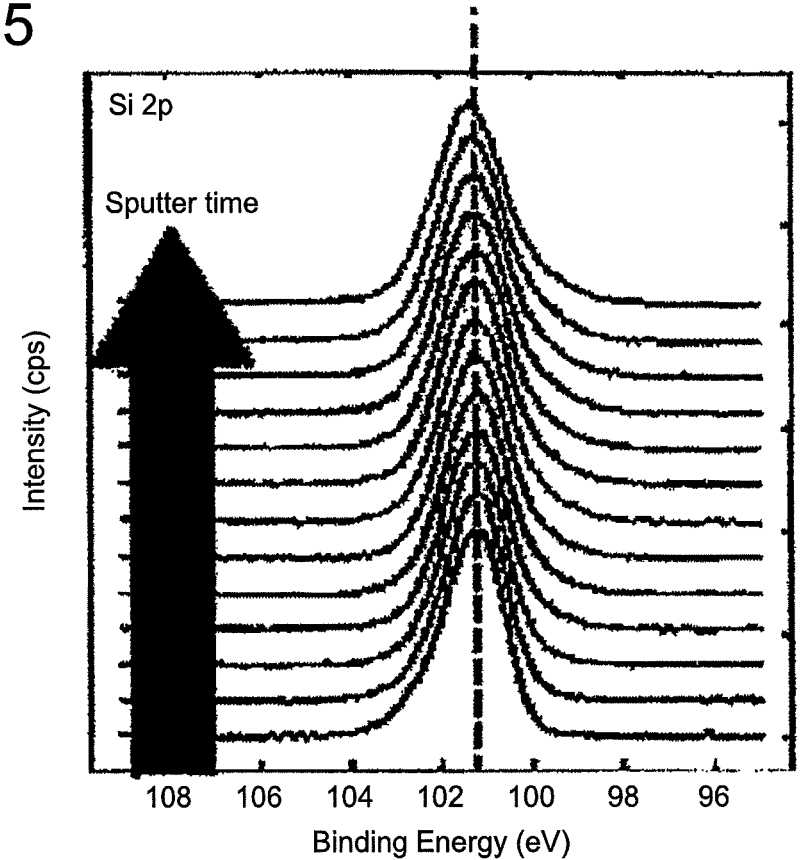
FIG. 5 is a graph representing how the Si2p binding energy in the measurement in FIG. 4 changes in the thickness direction of the intermediate layer.

The results obtained by conducting the same analysis to silicone rubber to which no treatment was applied are illustrated in FIG. 4 and FIG. 5.

Unlike FIG. 2, FIG. 4 has no maximal value for the oxygen concentrations and no minimal value for the carbon concentrations. Furthermore, FIG. 5 does not indicate that the Si2p bonding energy shift shifted toward the higher-energy side, thereby confirming that the number of oxygen atoms bonded to Si did not change.

Thus, the deactivator, such as a coupling agent, penetrates into the intermediate layer 4 by being allowed to permeate therein with the surface of the intermediate layer 4 coated therewith or dipped therein. When the coupling agent is a compound such as one expressed by General Formula (1), siloxane emerges in the intermediate layer 4 to the extent that it has a concentration distribution, and this distribution appears to be a distribution such that oxygen atoms contained in siloxane has a maximal value along the depth direction.

As a result, the intermediate layer 4 contains siloxane having a silicon atom bound to three to four oxygen atoms.

A method for the deactivation treatment is not limited to a dip process. For example, any method that enables oxygen atoms contained in siloxane to be in a distribution having a maximal value along the depth direction (the thickness direction) of the intermediate layer 4 is applicable. Examples of the method include methods such as plasma chemical vapor deposition (CVD), physical vapor deposition (PVD), sputtering, vacuum vapor deposition, and combustion chemical vapor-phase deposition.

The intermediate layer 4 does not need to have an initial surface potential while being left to stand still. The initial surface potential that the layer has while being left to stand can be measured under the following measurement conditions. Herein, not having the initial surface potential means that a potential is at or within ±10 V when being measured under the following measurement conditions.

Measurement Conditions

Pretreatment: After a sample is left to stand in an atmosphere having a temperature of 30° C. and relative humidity of 40% for 24 hours, charge neutralization is performed thereon for 60 seconds (by use of SJ-F300 manufactured by Keyence Corporation)
Device: Treck Model344
Measurement probe: 6000B-7C
Measurement distance: 2 mm
Measurement spot diameter: 10 mm in diameter It is presumed that, in the element according to the present embodiment, an electric signal is generated when electric charges move because charging through a mechanism similar to triboelectric charging, together with generation of a surface potential difference due to internal charge retention, produces biased capacitance as a result of the difference between deformation amounts based on the difference between degrees of hardness at the opposite surfaces of the intermediate layer 4.

In the element, the intermediate layer 4 is preferably not bonded to at least one of the first and the second electrodes 2 and 3. Furthermore, the intermediate layer 4 preferably has a space between the intermediate layer 4 and at least one of the first electrode 2 and the second electrode 3. This facilitates occurrence of triboelectric charging or abrasion charging, thereby making it possible to magnify an electric signal.

A method for providing the space is not particularly limited and may be selected as appropriate in accordance with the purpose. Examples of the method include a method in which to dispose a spacer between the intermediate layer 4 and the at least one of the first electrode 2 and the second electrode 3.

The spacer is not particularly limited and may be selected as appropriate in accordance with the purpose. Examples of a material for the spacer include a polymer material, an inorganic material, an organic-inorganic composite material, rubber, metal, a conductive polymer material, and a conductive rubber composition.

Examples of the polymer material include polyethylene, polypropylene, polyethylene terephthalate (PET), polyvinyl chloride, polyimide resin, fluororesin, and acrylic resin. Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone.

Examples of the inorganic material include silica, zinc oxide, titanium oxide, and aluminum hydroxide. A composite material of a polymer material and an inorganic material may be used.

Examples of the metal include gold, silver, copper, aluminum, stainless steel, tantalum, nickel, and phosphor bronze. Examples of the conductive polymer material include polythiophene, polyacetylene, and polyaniline. Examples of the conductive rubber composition include a composition containing conductive filler and rubber.

Examples of the conductive filler include a carbon material (for example, Ketjenblack, acetylene black, graphite, carbonaceous fiber, CF, CNF, CNT, or graphene), metal (for example, gold, silver, platinum, copper, iron, aluminum, or nickel), a conductive polymer material (for example, a derivative of any one of polythiophene, polyacetylene, polyaniline, polypyrrole, polyparaphenylene, and polyparaphenylene vinylene, or a material obtained by adding a dopant, the representative examples of which include anion and cation, to the derivative), and an ionic solution.

Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone.

Examples of the form of the spacer include a sheet, a film, a mesh, and a dot. Examples of the shape of the dot include a circular shape, a round columnar shape, and a rectangular columnar shape. The shape, the size, the arrangement position, and the like of the spacer are selected in accordance with the structure of the element. The shape, the size, the arrangement position, and the like thereof are set so that, in the initial state, there may be a space between the intermediate layer 4 and at least one of the first electrode 2 and the second electrode 3, and so that, upon application of pressing force, a state having the intermediate layer 4 in local contact with the at least one electrode is brought about with the intermediate layer 4 warping or with the spacer pressing and denting the intermediate layer 4.

Figure 6:
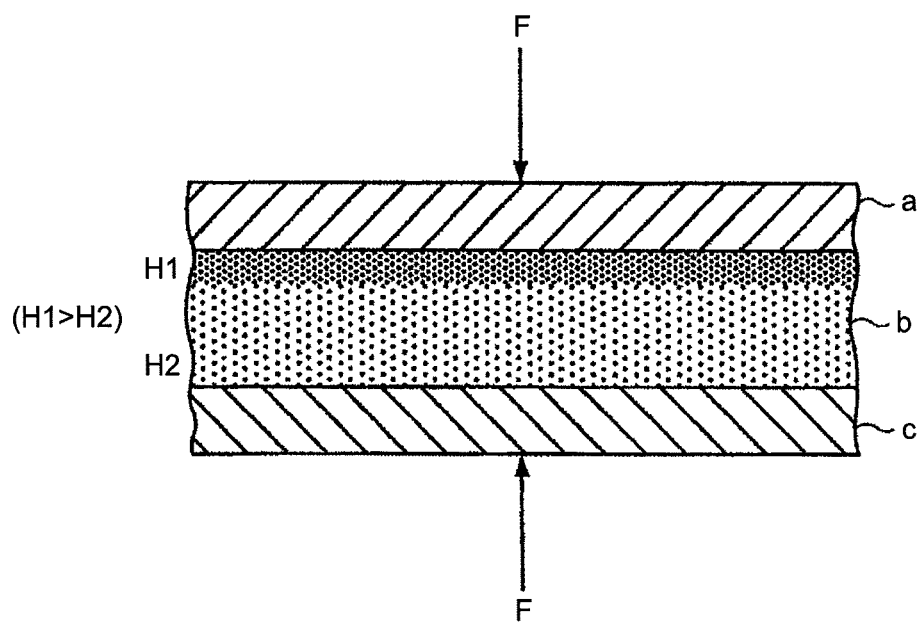
FIG. 6 is a sectional schematic for explaining characteristics of an element including an intermediate layer to which a surface modification treatment and a deactivation treatment have been applied.

As illustrated in FIG. 6, with the first electrode 2 indicated as a, the intermediate layer 4 indicated as b, and the second electrode 3 indicated as c, application of the surface modification treatment or the deactivation treatment to the first electrode a side of the intermediate layer b makes the first electrode a side of the intermediate layer b harder than the second electrode c side thereof. Therefore, the values of universal hardness thereof have a relation expressed as H1>H2.

Thus, when pressing force F that is the same deforming force acts on both the first electrode a side and the second electrode c side, the degree of deformation of the first electrode a side of the intermediate layer b is smaller than that of the second electrode c side thereof.

Based on FIG. 7A to FIG. 13, an input device (a second embodiment) including the input element 1 described above is described.

Figure 7A:
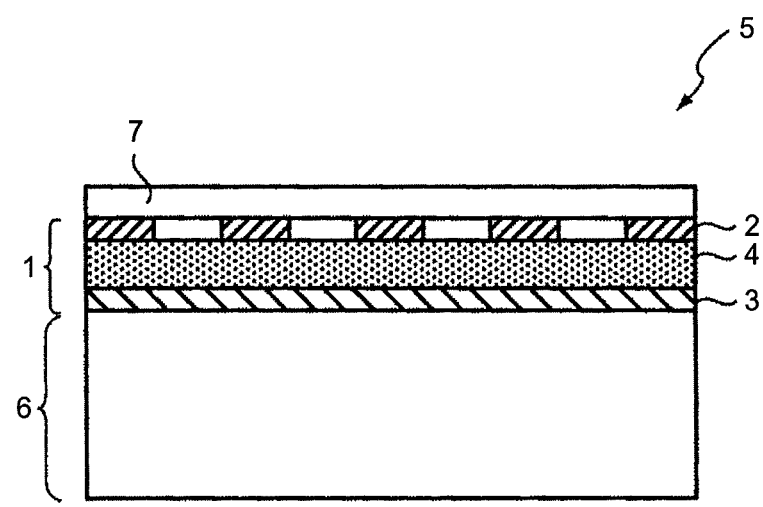
FIG. 7A is a schematic sectional view illustrating the configuration of an input device in a second embodiment.

As illustrated in FIG. 7A, the input device 5 includes: the input element 1; a display element 6; a protective layer 7 covering an upper surface of the first electrode 2 that faces an input operation surface (a visual contact surface); and a signal processor 8 (see FIG. 8) that processes an electric signal generated in response to pressing of the intermediate layer 4.

Figure 7B:
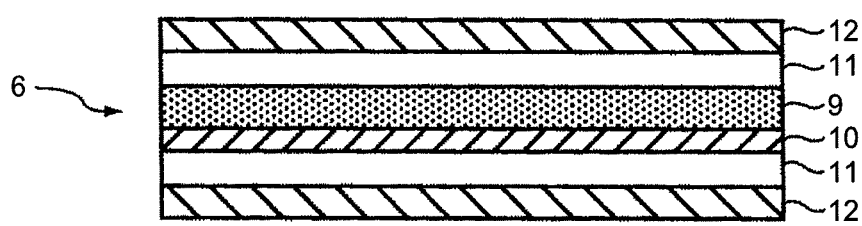
FIG. 7B is a detailed sectional view of a display element of the input device in the second embodiment.

The display element 6 includes liquid crystal 9, a thin-film transistor (TFT) 10, a pair of substrates 11, and a pair of polarization plates 12 as illustrated in FIG. 7B.

An integrated configuration of the input element 1 and the display element 6 constitutes a touch panel (a touch screen).

Figure 8:
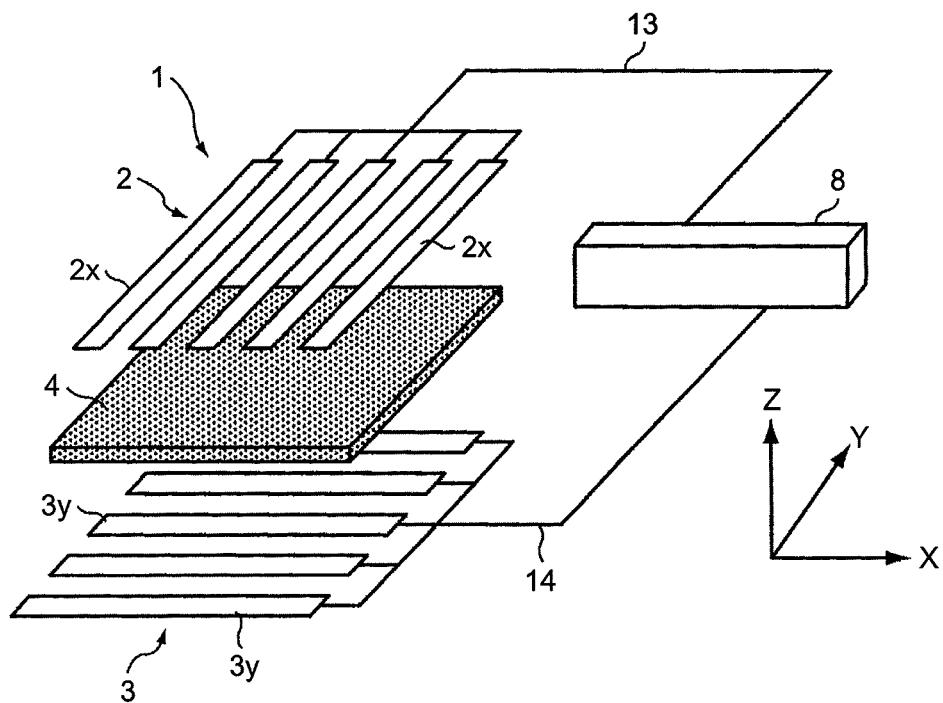
FIG. 8 is an exploded perspective view of the input device.

As illustrated in FIG. 8, the first electrode 2 of the input element 1 is formed of a plurality of electrodes 2x arrayed in stripe-like shapes in a first direction (the X direction). The second electrode 3 is formed of a plurality of electrodes 3y arrayed in stripe-like shapes in a second direction (the Y direction) perpendicular to the first direction.

The first electrode 2, the second electrode 3, and the intermediate layer 4 are stacked in a manner such that the intermediate layer 4 is interposed between the first electrode 2 and the second electrode 3 with the respective opposite surfaces of the intermediate layer 4 in the thickness direction (the Z direction) facing the first electrode 2 and the second electrode 3.

Each of the electrodes 2x of the first electrode 2 and each of the electrodes 3y of the second electrode 3 are electrically connected via wiring 13 and wiring 14, respectively, to the signal processor 8.

Figure 9:
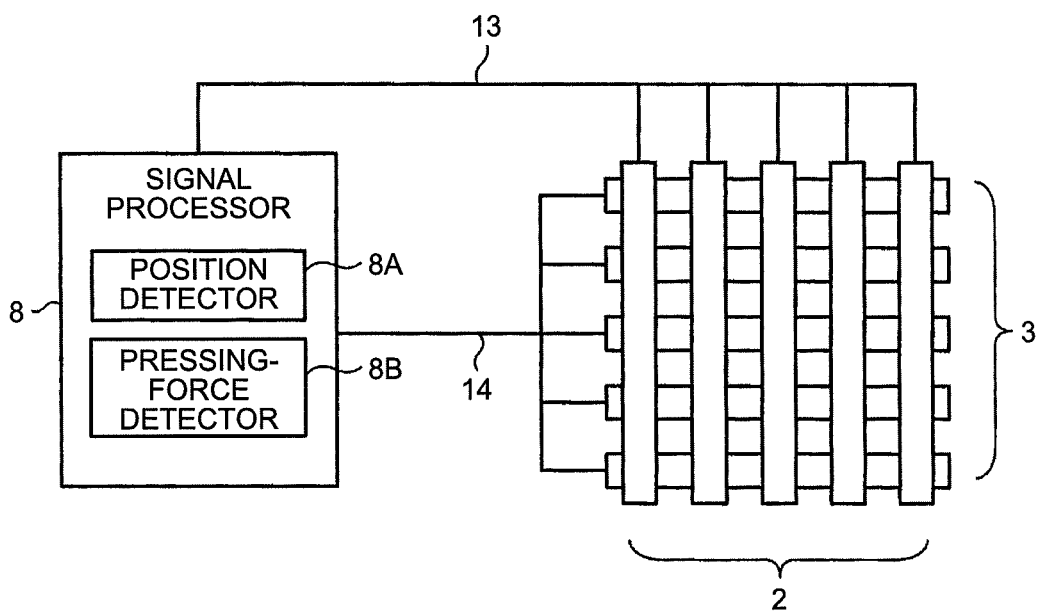
FIG. 9 is a control configuration diagram of the input device.

As illustrated FIG. 9, the signal processor 8 includes: a position detector 8A that detects the position of pressing; and a pressing-force detector 8B that detects pressing force.

An electric signal emitted from the intermediate layer 4 in response to pressing passes through the electrode that corresponds to the position of the pressing to be input to the signal processor 8. The position detector 8A detects (specifies) the position of the pressing based on coordinates that correspond to a position at which the electric signal has been generated among coordinates arranged in a matrix, which are determined by the combination of the first electrode 2 and the second electrode 3. Concurrently, the pressing-force detector 8B detects the size of pressing force based on a voltage value of the waveform of the signal.

For detection of pressing force, the peak value of a voltage signal generated thereby may be used, or the time integral of voltage may be used. It is desirable that processing appropriate in accordance with an assumed purpose be performed.

Figure 10:
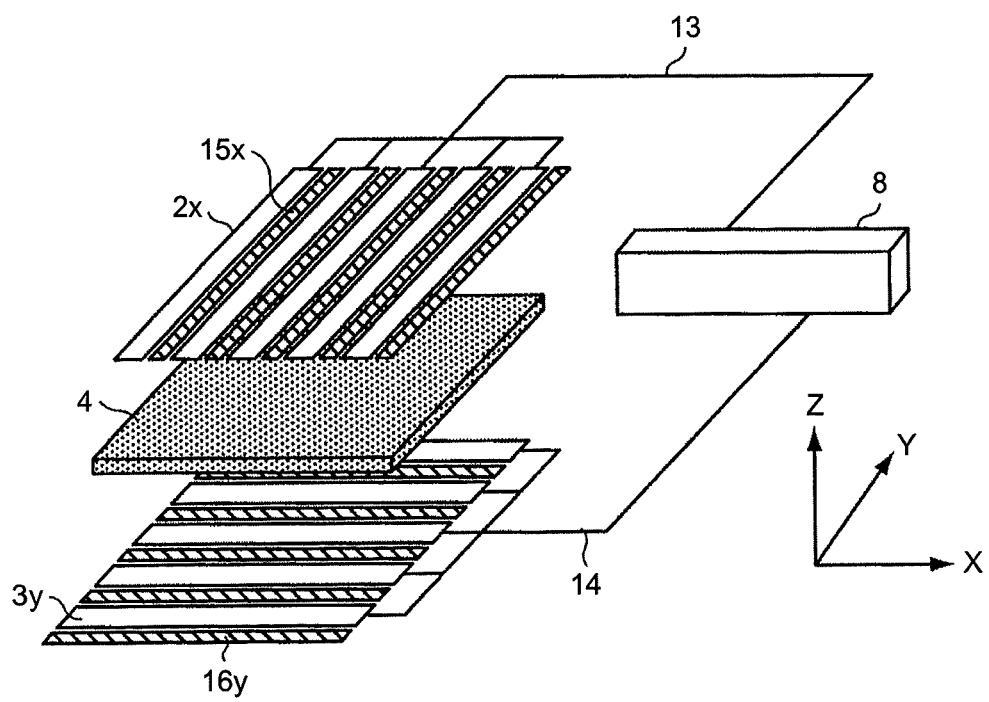
FIG. 10 is an exploded perspective view of an input device according to a modification.
Figure 11:
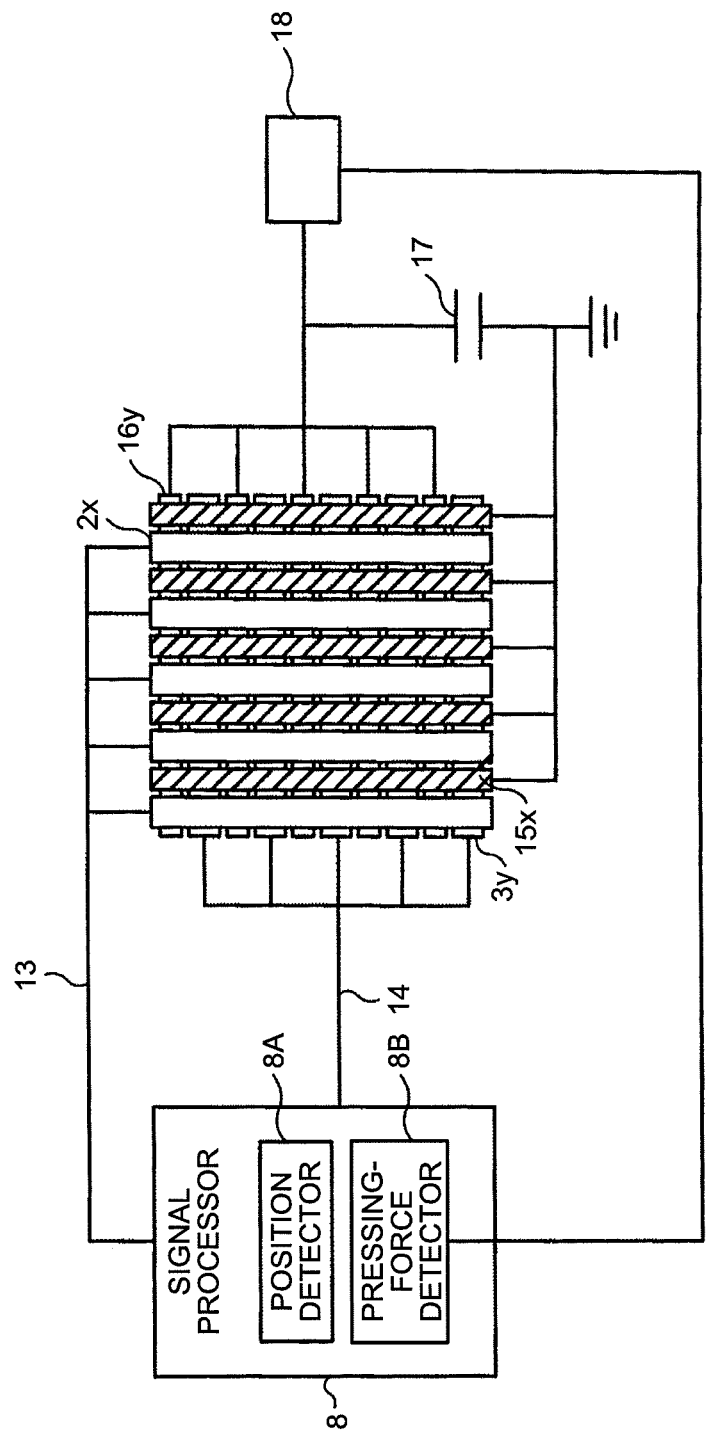
FIG. 11 is a control configuration diagram of the input device.

FIG. 10 and FIG. 11 illustrate modifications of the input device 5.

As illustrated in FIG. 10, ground electrodes 15x are alternately with the electrodes 2x of the first electrode 2 in the X direction, and force measuring electrodes 16y to be used for force measurement are arranged in the Y direction.

The electrodes for detecting force and the electrodes for detecting a position are provided separately and grounded, which enables obtaining more accurate signal voltage values.

As in the case of the configuration illustrated in FIG. 8, the position detector 8A detects (specifies) the position of the pressing force based on coordinates that correspond to a position at which the electric signal has been generated by pressing force among coordinates arranged in a matrix, which are determined by the combination of the first and the second electrodes 2 and 3.

As illustrated in FIG. 11, the force measuring electrodes 16y are connected to a capacitor 17 and a voltage detector 18 via a resistor not illustrated. The ground electrodes 15x are grounded. Electric charge generated in the intermediate layer 4 by pressing force and detected by the force measuring electrodes 16y is measured as a voltage signal from the capacitor 17.

A voltage value obtained by the measurement is a value indicating pressing force and continues being held in the capacitor 17 while the force is being applied. Thus, a static pressure can be detected. The above-described manner enables both obtaining values for the position of pressing and a value for pressing force from the single intermediate layer 4 and detecting a static pressure.

A material of the protective layer 7 that provides protection against repetitive input operations is not particularly limited and may be selected as appropriate in accordance with the purpose. Examples of the protective layer 7 include those made of acrylic resin, polyethylene terephthalate resin, polycarbonate resin, polypropylene resin, polyamide resin, polyimide resin, and a glass plate. An antireflective layer, an anti-scratch or antifouling hard coating layer, and the like may be formed on a surface of the protective layer 7.

A material for the substrate 11 of the display element 6 is not particularly limited and may be selected as appropriate in accordance with the purpose. Examples of the substrate 11 include those made of acrylic resin, polyethylene terephthalate resin, polycarbonate resin, polyamide resin, polyimide resin, and a glass plate.

The display element in which the input element according to the present invention is used as a touch panel while being laid on top of the display element is not particularly limited and may be selected as appropriate in accordance with the purpose. Examples of the display element include a liquid crystal display, an organic EL display, a plasma display, and electronic paper.

Figure 12:
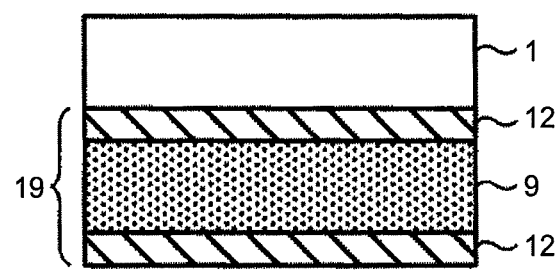
FIG. 12 is a schematic sectional view illustrating the configuration of a touch panel including an input element according to the present invention.

A manner for combination with the display element is not particularly limited except that a structure enabling a signal that corresponds to pressing force to be acquired from the input element according to the present invention needs to be employed. As illustrated in FIG. 12, what is called an external touch panel (input device) obtained by stacking the input element 1 on the display element 19 that is conventionally known, which has the liquid crystal 9 interposed between the polarization plates 12 can be suitably used as a basic embodiment.

Figure 13:
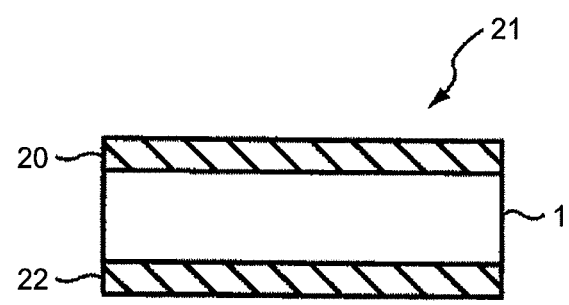
FIG. 13 is a schematic sectional view illustrating the configuration of a touchpad including an input element according to the present invention.

As illustrated in FIG. 13, a touchpad 21 functioning as an independent position input element (a pointing device) can be constructed by having the input element 1 according to the present invention covered by an insulating cover sheet 20. In FIG. 13, reference sign 22 indicates an insulating layer.

When the input device is used as a touchpad, an electronic device fitted with the display element to be used in combination therewith is not particularly limited, and examples thereof includes a touchpad that accompanies a notebook-size personal computer, a graphics tablet that accompanies a drawing and graphics device, and an input controller that accompanies a game machine or the like.

The following mainly describes input elements each including spacers, based on FIGS. 14A to 16B.

Figure 14A:
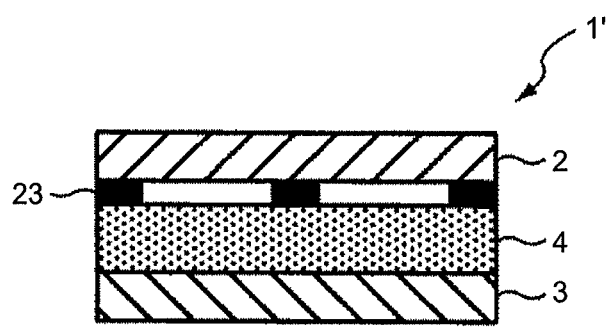
FIG. 14A is a schematic sectional view of an input element including spacers and is a view illustrating an input element as an embodiment.

As illustrated in FIG. 14A, an input element 1' includes spacers 23 between the first electrode 2, which faces the surface-modified side of the intermediate layer 4, and the intermediate layer 4. Note that each of the first and the second electrodes 2 and 3 may have stripe-like shapes as described above or may be planar.

As a result of the inclusion of the spacers 23, a part of the intermediate layer 4 and a part of the first electrode 2 are not joined to each other, which facilitates occurrence of triboelectric charging or abrasion charging, thereby making it possible to magnify an electric signal (output voltage), as described above.

Figure 14B:
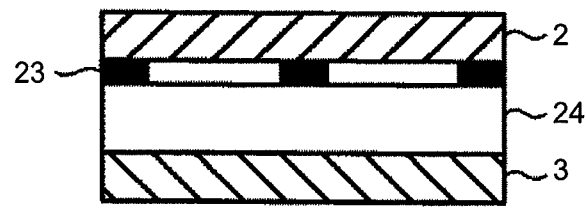
FIG. 14B is a schematic sectional view of an input element including spacers and illustrates an input element as a comparative example.

FIG. 14B illustrates the configuration of a comparative example to be described later, in which PVDF 24 is included in place of the intermediate layer 4.

Figure 15A:
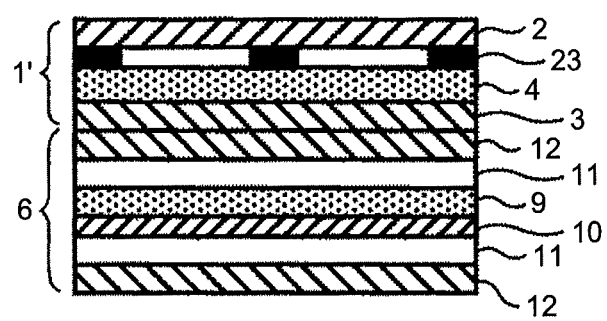
FIG. 15A is a schematic sectional view of an external touch panel and illustrates an example in which an input element is disposed facing the front-surface side (operation surface side) of a display element.
Figure 15B:
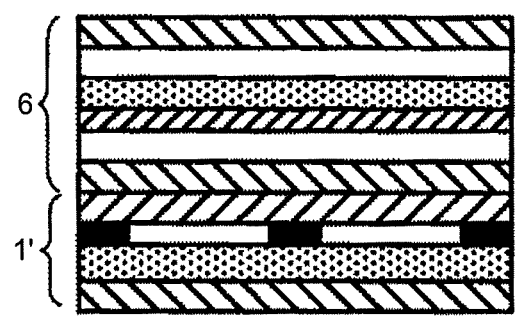
FIG. 15B is a schematic sectional view of an external touch panel and illustrates an example in which an input element is disposed facing the back-surface side of a display element.

FIG. 15A illustrates an external touch panel provided with the input element that includes spacers. FIG. 15B is an example in which the input element is provided facing a surface side being opposite to the input operation surface side of the display element 6.

As is apparent from examples to be described later, the input element according to the present invention is highly sensitive to pressing force, and therefore, can be alternatively disposed facing one side of the display element 6 that is opposite to another side thereof to which pressing force is applied, as illustrated FIG. 15B. This allows for enhanced flexibility in designing an electronic apparatus provided with an input element.

Figure 16A:
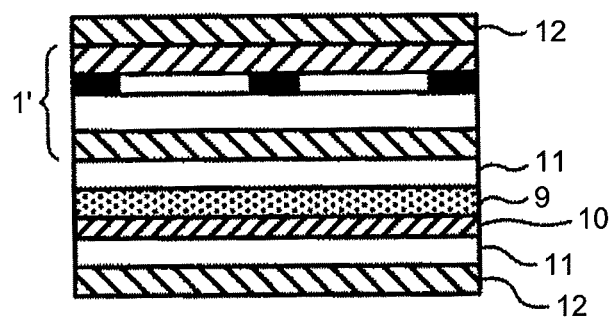
FIG. 16A is a schematic sectional view of a non-external touch panel and illustrates an example that includes spacers.
Figure 16B:
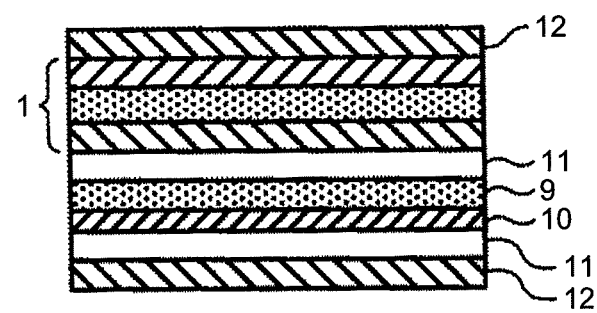
FIG. 16B is a schematic sectional view of a non-external touch panel and illustrates an example that includes no spacers.

FIG. 16A illustrates a non-external touch panel, and FIG. 16B illustrates the configuration of a non-external touch panel that includes no spacers.

Figure 23:
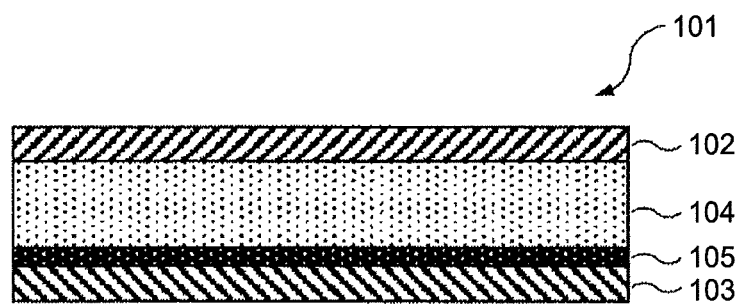
FIG. 23 is a schematic sectional view illustrating the configuration of an input element according to a third embodiment of the present invention.

FIG. 23 illustrates a third embodiment of the present invention.

As illustrated in FIG. 23, an input element 101 according to this embodiment includes: a first electrode 102 and a second electrode 103 facing each other; and an intermediate layer 104 disposed between the first and the second electrodes 102 and 103 and made of rubber containing siloxane or a rubber composition containing siloxane. The input element 101 further includes a heat-resisting layer 105 between the intermediate layer 104 and the second electrode 103. The intermediate layer 104 has a concentration profile only in one side (one of the opposite sides) thereof that faces the first electrode 102. The intermediate layer 104 further has the other side thereof and the second electrode 103 that faces this side thermally bonded together by means of the heat-resisting layer 105 therebetween that has a capability to serve as a bonding layer.

The input element 101 illustrated in FIG. 23 is unlikely to have the detection sensitivity thereof decreased even when being exposed to a high temperature. This configuration makes the input element less restricted by environmental conditions, thereby enabling an input element to be provided that contributes to enhancement of usability of an electronic apparatus such as a smartphone.

Heat-Resisting Layer

A material that has adhesiveness is preferable, and a material that becomes adhesive when being heated is particularly preferable, for the heat-resisting layer 105. Examples of the heat-resisting layer 105 that becomes adhesive when being heated include more than a few examples that are heat-resistant and are suitable for being used in an element that needs to be highly reliable in a high-temperature environment. Unlike ultraviolet (UV) curing, a heating adhesion process imposes no limitation on colors of members needed to be bonded together and allows materials for an element of any colors to be bonded together. In addition, heating pressure adhesion is allowed in the course of manufacturing an element, thereby enabling the members to be strongly bonded together.

Desirably, one side of the intermediate layer 104 that has no concentration profile, in other words, one side thereof to which no surface modification treatment has been applied, and the second electrode 103 that faces this side are bonded together without misalignment therebetween. This is because the problem of reduced output attributable to signal offset due to mismatched phases occurs in the unbonded state.

Examples of a material for the heat-resisting layer 105, which doubles as a bonding layer include a thermosetting material and a thermoplastic material.

Examples of the thermosetting material include acrylic resin-based, epoxy resin-based, urethane resin-based, silicone based, modified silicone based, and phenol resin-based materials. Examples of the thermoplastic material include ethylene vinyl acetate resin-based, polyamide resin-based, thermoplastic polyurethane resin-based, and thermoplastic polyester resin-based materials. One of these materials may be used alone, or two or more thereof may be used in combination.

Desirably, the heat-resisting layer 105 is made of a material having a thermal property that is the same as or equivalent to the thermal property of the intermediate layer 104. Note that "a thermal property that is the same as or equivalent" means that the coefficient of thermal expansion that is close, which means that, within a temperature range in which the input element 101 is used, the difference in volume increase between the heat-resisting layer 105 and the intermediate layer 104 due to a change in temperature falls within a designed range. This configuration is employed because it can prevent the above-described inconvenience attributable to factors such as boundary separation or mismatched phases caused by a change in the environment because of the difference in coefficient of thermal expansion. This embodiment employs silicone for the intermediate layer 104, which makes it desirable that a silicone based or modified silicone based material, which has a high affinity for silicone in terms of material property, be used also for the heat-resisting layer 105.

The average thickness of the heat-resisting layer 105 is not particularly limited and may be selected as appropriate in accordance with the purpose. However, the average thickness thereof is preferably 1 μm to 500 μm, more preferably 10 μm to 300 μm, in view of deformation followability. When the average thickness is within the preferable range, adhesiveness is secured, and deformation is undisturbed. It is thus made possible to highly sensitively and highly accurately detect at least one of: information on a position at which an operation with pressing force has been performed; and information on the pressing force.

In the case of including the heat-resisting layer 105 between the electrode and the intermediate layer, the heat-resisting layer 105 preferably has conductivity. The heat-resisting layer 105 preferably has conductivity such that the volume resistivity thereof is lower than or equal to $10^3$ Ωcm.

The heat-resisting layer 105 may be provided on the entire surfaces of the members needed to be bonded or may be provided on parts of the respective surfaces thereof.

Note that an adhesive tape that has heat resistance may be used as the heat-resisting layer 105.

FIG. 24A to FIG. 24D illustrate examples of a modification of the input element 101 that includes the heat-resisting layer 105.

Figure 24A:
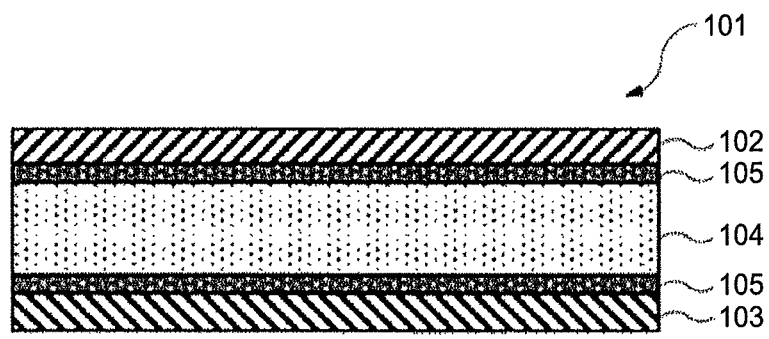
FIG. 24A is a schematic sectional view illustrating a first example of a modification of the input element according to the third embodiment.

In the input element 101 illustrated in FIG. 24A according to a first example of the modification, respective surfaces of the first electrode 102 and the intermediate layer 104 are entirely bonded together by means of the heat-resisting layer 105 therebetween, and respective surfaces of the intermediate layer 104 and the second electrode 103 are entirely bonded together by means of the heat-resisting layer 105 therebetween.

Figure 24B:
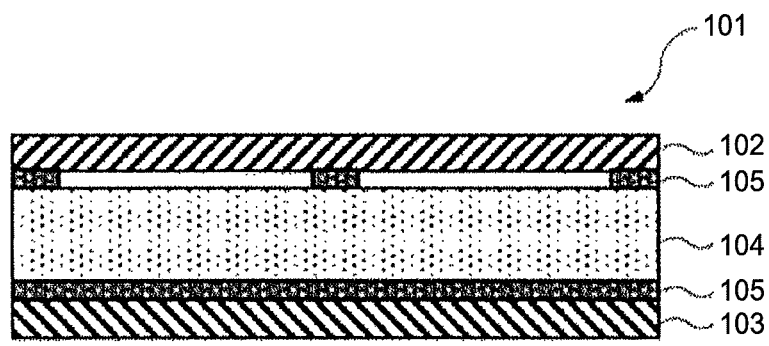
FIG. 24B is a schematic sectional view illustrating a second example of the modification of the input element according to the third embodiment.

In the input element 101 illustrated in FIG. 24B according to a second example of the modification, respective surfaces of the first electrode 102 and the intermediate layer 104 are partly bonded together by means of the heat-resisting layer 105 therebetween, and respective surfaces of the intermediate layer 104 and the second electrode 103 are entirely bonded together by means of the heat-resisting layer 105 therebetween.

Figure 24C:
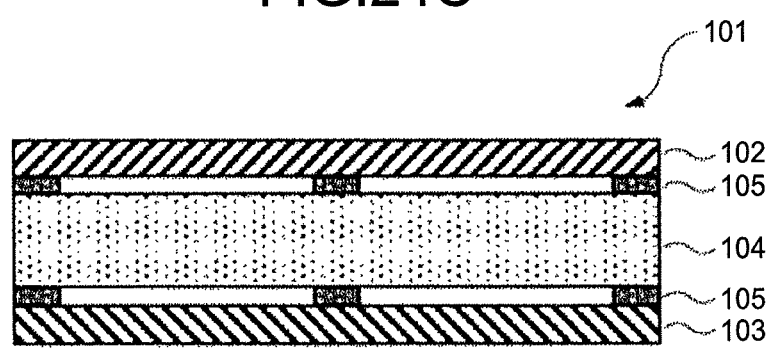
FIG. 24C is a schematic sectional view illustrating a third example of the modification of the input element according to the third embodiment.

In the input element 101 illustrated in FIG. 24C according to a third example of the modification, respective surfaces of the first electrode 102 and the intermediate layer 104 are partly bonded together by means of the heat-resisting layer 105 therebetween, and respective surfaces of the intermediate layer 104 and the second electrode 103 are partly bonded together by means of the heat-resisting layer 105 therebetween.

Figure 24D:
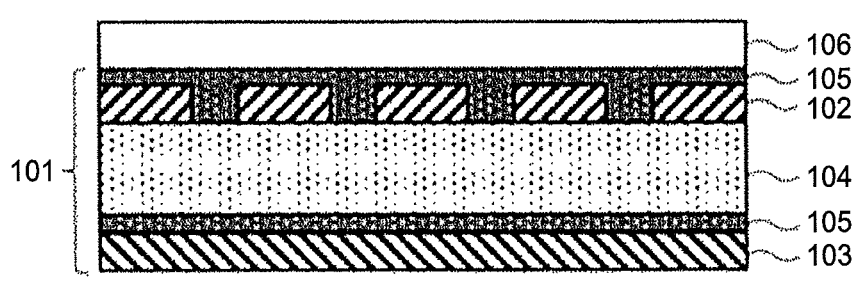
FIG. 24D is a schematic sectional view illustrating a fourth example of the modification of the input element according to the third embodiment.

In the input element 101 illustrated in FIG. 24D according to a fourth example of the modification, respective surfaces of a protective layer 106 covering the upper surface of the first electrode 102, the first electrode 102, and the intermediate layer 104 are entirely or partly bonded together by means of the heat-resisting layer 105 therebetween, and respective surfaces of the intermediate layer 104 and the second electrode 103 are entirely bonded together by means of the heat-resisting layer 105 therebetween.

Each of the input elements 101 illustrated in FIG. 24A to FIG. 24D has respective surfaces of members that constitute the element entirely or partly bonded together by means of the heat-resisting layer 105 therebetween, thereby having a structure that makes it unlikely to have the detection sensitivity thereof decreased even when the element is exposed to an extremely high temperature (for example, 150° C.)

In each of the input elements 101 illustrated in FIG. 24A to FIG. 24D, a part of the intermediate layer 104 and a part of at least one of the first and the second electrodes are not joined to each other, which facilitates occurrence of triboelectric charging or abrasion charging, thereby making it possible to magnify an electric signal (output voltage), as described above. Note that each of the first and the second electrodes may have stripe-like shapes or may be planar.

FIG. 25A to FIG. 25D illustrate examples of another modification (of the type that includes spacers) of the input element 101 that includes the heat-resisting layer 105.

Figure 25A:
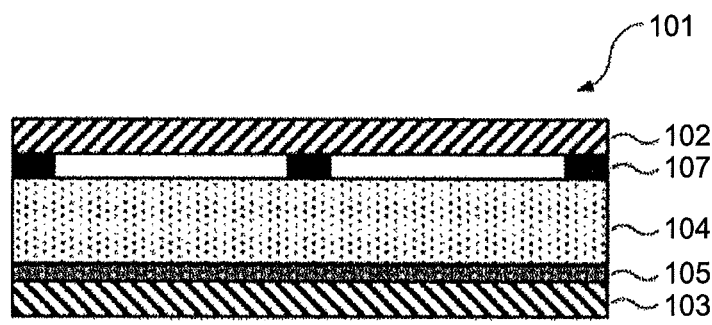
FIG. 25A is a schematic sectional view illustrating a first example of another modification of the input element according to the third embodiment.

The input element 101 illustrated in FIG. 25A according to a first example of this other modification includes spacers 107 between the first electrode 102, which faces the surface-modified side of the intermediate layer 104, and the intermediate layer 104.

Figure 25B:
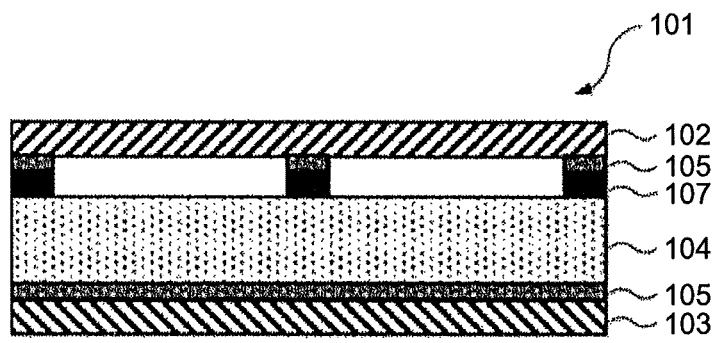
FIG. 25B is a schematic sectional view illustrating a second example of the other modification of the input element according to the third embodiment.

The input element 101 illustrated in FIG. 25B according to a second example of this other modification has a configuration obtained by modifying the configuration in FIG. 25A in a manner such that the first electrode 102 and each of the spacers 107 are bonded together by means of the heat-resisting layer 105 therebetween.

Figure 25C:
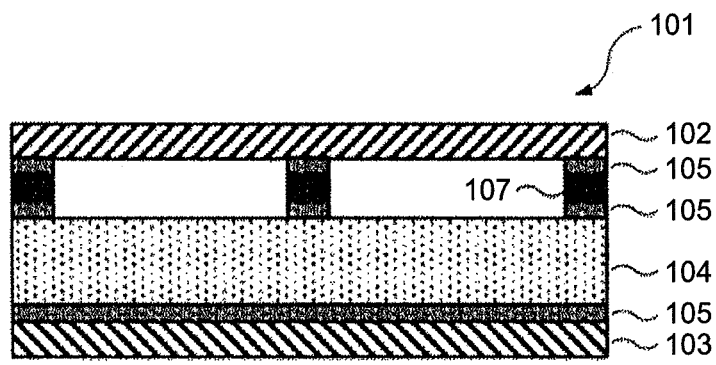
FIG. 25C is a schematic sectional view illustrating a third example of the other modification of the input element according to the third embodiment.

The input element 101 illustrated in FIG. 25C according to a third example of this other modification has a configuration obtained by further modification such that the intermediate layer 104 and each of the spacers 107 are bonded together by means of the heat-resisting layer 105 therebetween.

Figure 25D:
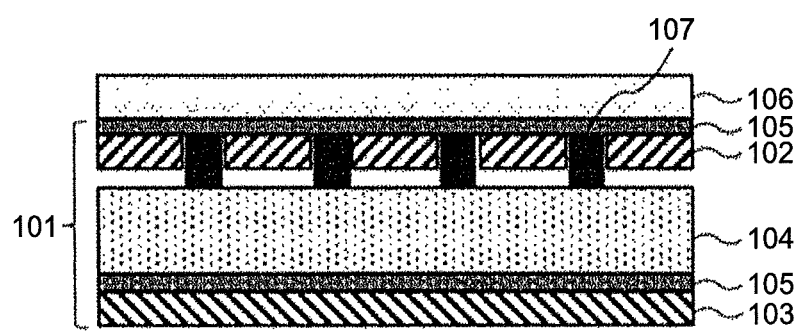
FIG. 25D is a schematic sectional view illustrating a fourth example of the other modification of the input element according to the third embodiment.

The input element 101 illustrated in FIG. 25D according to a fourth example of this other modification has a configuration obtained by further modification such that, in one side of the first electrode 102 that faces away from the intermediate layer 104, the first electrode 102 and the protective layer 106 are bonded together by means of the heat-resisting layer 105 therebetween, and so are each of the spacers 107 and the protective layer 106.

As a result of the inclusion of the spacers 107, a part of the intermediate layer 104 and a part of the first electrode 102 are not bonded to each other, which facilitates occurrence of triboelectric charging or abrasion charging, thereby making it possible to further magnify an electric signal (output voltage), as described above. Respective surfaces of members that constitute the element partly bonded together by means of the heat-resisting layer 105 therebetween, thereby having a structure that makes it unlikely to have the detection sensitivity thereof decreased even when the element is exposed to an extremely high temperature. Note that each of the first and the second electrodes may have stripe-like shapes or may be planar.

The input element 101 according to the present invention can be used for the input device 5 according to the present invention in the same manner as the input elements 1 and 1' described above.

EXAMPLES

Example 1

<Fabrication of Input Element>

An input element having a sectional structure illustrated in FIG. 14A was fabricated by the following procedure.

Two experimental substrates were prepared each including: a PET substrate cut out into a size of 40 mm×40 mm; and an ITO electrode formed thereon in stripe-like shapes having L/S (line/space)=8 mm/2 mm. Spherical silica particles serving as spacers and having a diameter of 10 μm were prepared. A spacer spray solution obtained by dispersing the spherical silica particles in isopropyl alcohol was prepared; and the solution was sprayed onto an electrode-mounted surface of one (a first substrate) of the substrates by use of a spin-coating machine and dried to form the spacers.

The precursor of an intermediate layer was formed with a thickness of 100 μm in a manner such that, after silicone rubber (TSE3033 manufactured by Momentive Performance Materials Japan LLC) was applied to a PET film, the PET film was thermally cured for 30 minutes at 120° C.

Furthermore, a surface modification treatment and a deactivation treatment were applied to the precursor of the intermediate layer, and the PET film was then removed, so that the intermediate layer was obtained.

(Surface Modification Treatment)

As the surface modification treatment, a plasma treatment was applied with the following conditions (treatment conditions: PR-500 manufactured by Yamato Scientific Co., Ltd.; an output of 100 W; a treatment period of three minutes; a reaction atmosphere containing 99.999% Argon; and a reaction pressure of 10 Pa).

(Deactivation Treatment)

After the surface modification treatment, a solution containing 0.1° fluorinated carbon compound (OPTOOL DSX manufactured by Daikin Industries, Ltd.) and having perfluorohexane as a diluent was applied to a treated surface of the precursor of the intermediate layer through a dip process at a pulling speed of 10 mm/min. Thereafter, the deactivation treatment was applied in a manner such that the precursor was left for 30 minutes or longer in an environment having a relative humidity of 90% and a temperature of 60° C. and then dried for 10 minutes at 50° C.

The intermediate layer was stuck onto the other substrate (a second substrate). Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other and were fixed to each other by being bonded together by means of an adhesive agent, so that the input element as Example 1 was fabricated.

<Evaluation>

Output signals corresponding to pressing force applied to the fabricated input element were evaluated. Output voltage was recorded when a silicone sponge (manufactured by Sunpolymer Co., Ltd., the model number of which is Si200) having a thickness of 5 mm was attached to the tip of a round columnar metal probe having a diameter of 10 mm and was pressed at a position at which the center thereof corresponds to an intersection of the first and the second electrodes with loads varied from 50 gf, to 100 gf, to 200 gf, and to 400 gf. As the output voltage, an average of 10 measurement values was taken. Table 1 provides the result.

TABLE 1

| | [List of output voltage values (V) measured in examples] | | | | | | |
|---|---|---|---|---|---|---|---|
| Load [gf] | Example 1 | Comparative Example 1 (PVDF) | Example 2 (no spacer) | Example 3 | Example 4 | Example 5 | Example 6 |
| 50 | 1.40 | Unable to detect | 0.55 | 0.81 | 1.01 | 1.1 | 0.43 |
| 100 | 1.42 | Unable to detect | 0.71 | 0.97 | 1.16 | 1.29 | 0.68 |
| 200 | 1.73 | 0.28 | 0.97 | 1.37 | 1.51 | 1.78 | 1.11 |
| 400 | 3.14 | 1.13 | 2.03 | 2.35 | 2.78 | 3.33 | 2.26 |

As Table 1 clearly indicates, the input element according to the present invention had a voltage signal detected with high reproducibility each time when the measurement was performed and was confirmed as having had output of 1.4 V even when the pressing load of 50 gf was applied.

Comparative Example 1

<Preparation of Input Element>

An input element as Comparative Example 1 was fabricated in the same manner as the input element as Example 1 except that, in the input element of Example 1, the intermediate layer was replaced with PVDF (manufactured by Tokyo Sensor Co., Ltd. and having a thickness of 110 μm). That is, an input element having a sectional structure illustrated in FIG. 14B was fabricated.

<Evaluation>

With respect to the input element fabricated as Comparative Example 1, output voltage was evaluated in the same manner as with respect to Example 1. Table 1 provides the result.

As Table 1 clearly indicates, output voltage was unable to be detected when the small pressing force (50 gf and 100 gf)

was applied. In addition, this element was found to have lower output voltage values even when the large pressing force was applied, and accordingly have lower sensitivity to pressing force, than the input element according to the present invention. In other words, this element has a high detection-limit voltage value.

Example 2

<Preparation of Input Element>

An input element as Example 2 was fabricated in the same manner as the input element as Example 1 except that, in the input element as Example 1, no spacer was provided on the electrode-mounted surface of the first substrate. That is, an input element having a sectional structure illustrated in FIG. 1 was fabricated.

<Evaluation>

With respect to the input element fabricated as Example 2, output voltage was evaluated in the same manner as with respect to Example 1. Table 1 provides the result.

This element was found to have lower output voltage than the input element that includes spacers but have higher sensitivity to pressing force than Comparative Example 1 including PVDF. In other words, by having a gap provided between the electrode and the intermediate layer or having the electrode and the intermediate layer not bonded to each other, the input element can facilitate occurrence of triboelectric charging or abrasion charging and accordingly provide a large electric signal.

Example 3

<Preparation of Input Element>

An element having a sectional structure illustrated in FIG. 14A was fabricated by the following procedure.

Two experimental substrates were prepared each including: a PET substrate cut out into a size of 40 mm×40 mm; and an ITO electrode formed thereon in stripe-like shapes having L/S=8 mm/2 mm. Spherical silica particles serving as spacers and having a diameter of 10 μm were prepared. A spacer spray solution obtained by dispersing the spherical silica particles in isopropyl alcohol was prepared; and the solution was sprayed onto an electrode-mounted surface of one (a first substrate) of the substrates by use of a spin-coating machine and dried to form the spacers.

The precursor of an intermediate layer was formed with a thickness of 50 μm in a manner such that, after silicone rubber (TSE3033 manufactured by Momentive Performance Materials Japan LLC) was applied to a surface of the other substrate (a second substrate), the substrate was thermally cured for 30 minutes at 120° C. Furthermore, a surface modification treatment was applied to the precursor of the intermediate layer, so that the intermediate layer was obtained.

(Surface Modification Treatment)

As the surface modification treatment, a corona discharge treatment was applied with the following conditions (treatment conditions: applied voltage of 100 V; cumulative energy of 60 J/cm$^2$; and a reaction atmosphere of air).

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other and were fixed to each other by being bonded together by means of an adhesive agent, so that the input element as Example 3 was fabricated.

<Evaluation>

With respect to the input element fabricated as Example 3, output voltage was evaluated in the same manner as with respect to Example 1. Table 1 provides the result.

While having differences with Example 1 in terms of thickness of the intermediate layer and applied treatment, this input element was found to have higher sensitivity to pressing force than Comparative Example 1 and Example 2, which includes no spacers.

Fourth Example

<Preparation of Input Element>

An element having a sectional structure illustrated in FIG. 14A was fabricated by the following procedure.

Two experimental substrates were prepared each including: a PET substrate cut out into a size of 40 mm×40 mm; and an ITO electrode formed thereon in stripe-like shapes having L/S=8 mm/2 mm. A film spacer (U34 Lumirror #50 manufactured by Toray Industries, Inc., having a thickness of 50 μm) was formed in stripe-like shapes having L/S=1 mm/9 mm and fixed on an electrode-mounted surface of one (a first substrate) of the substrates.

The precursor of an intermediate layer was formed with a thickness of 100 μm in a manner such that, after a silicone rubber composition was applied to a surface of the other substrate (a second substrate), the substrate was thermally cured for 30 minutes at 120° C., the silicone rubber composition being made of 100 mass parts of silicone rubber (TSE3033 manufactured by Momentive Performance Materials Japan LLC) and 20 mass parts of silica (R972 manufactured by Nippon Aerosil Co., Ltd.). Furthermore, a surface modification treatment was applied to the precursor of the intermediate layer, so that the intermediate layer was obtained.

(Surface Modification Treatment)

As the surface modification treatment, a UV irradiation treatment was applied with the following conditions (treatment conditions: VL-215.0 manufactured by Vilber Lourmat; a wavelength of 254 nm; a cumulative light quantity of 300 J/cm$^2$; and a reaction atmosphere of nitrogen with an oxygen partial pressure of 5,000 ppm or lower).

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other and were fixed to each other by being bonded together by means of an adhesive agent, so that the input element as Example 4 was fabricated.

<Evaluation>

With respect to the input element fabricated as Example 4, output voltage was evaluated in the same manner as with respect to Example 1. Table 1 provides the result.

While having differences with Example 1 in terms of spacer and applied treatment, this input element was found to have higher sensitivity to pressing force than Comparative Example 1, and Example 2, which includes no spacers.

Example 5

<Preparation of Input Element>

An element having a sectional structure illustrated in FIG. 14A was fabricated by the following procedure.

Two experimental substrates were prepared each including: a PET substrate cut out into a size of 40 mm×40 mm; and an ITO electrode formed thereon in stripe-like shapes having L/S=8 mm/2 mm. A film spacer (U34 Lumirror #50 manufactured by Toray Industries, Inc., having a thickness of 50 μm) was formed in stripe-like shapes having L/S=1 mm/9 mm and fixed on an electrode-mounted surface of one (a first substrate) of the substrates.

The precursor of an intermediate layer was formed with a thickness of 100 μm in a manner such that a silicone rubber composition was applied to a surface of the other substrate (a second substrate) and then thermally cured for 30 minutes at 120° C., the silicone rubber composition being made of 100 mass parts of silicone rubber (KE-1935 manufactured by Shin-Etsu Chemical Co., Ltd.) and 50 mass parts of barium titanate (208108 manufactured by Sigma-Aldrich Corporation). Furthermore, a surface modification treatment was applied to the precursor of the intermediate layer, so that the intermediate layer was obtained.

(Surface Modification Treatment)

As the surface modification treatment, an electron beam irradiation treatment was applied with the following conditions (treatment conditions: a linear-irradiation type low-energy electron beam irradiation source manufactured by Hamamatsu Photonics K.K.; an irradiation quantity of 1 MGy; and a reaction atmosphere of nitrogen with an oxygen partial pressure of 5,000 ppm or lower).

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other and were fixed to each other by being bonded together by means of an adhesive agent, so that the input element as Example 5 was fabricated.

<Evaluation>

With respect to the input element fabricated as Example 5, output voltage was evaluated in the same manner as with respect to Example 1.

Table 1 provides the result.

While having differences with Example 1 in terms of spacer, applied treatment, and silicone rubber for the intermediate layer, this input element was found to have higher sensitivity to pressing force than Comparative Example 1, and Example 2, which includes no spacers.

Sixth Example

<Preparation of Input Element>

An element having a sectional structure illustrated in FIG. 14A was fabricated by the following procedure.

Two experimental substrates were prepared each including: a PET substrate cut out into a size of 40 mm×40 mm; and an ITO electrode formed thereon in stripe-like shapes having L/S=8 mm/2 mm. Spherical silica particles serving as spacers and having a diameter of 10 μm were prepared. A spacer spray solution obtained by dispersing the spherical silica particles in isopropyl alcohol was prepared; and the solution was sprayed onto an electrode-mounted surface of one (a first substrate) of the substrates by use of a spin-coating machine and dried to form the spacers.

The precursor of an intermediate layer was formed with a thickness of 150 μm in a manner such that a rubber composition was applied to a surface of a PET film and then thermally cured for 30 minutes at 120° C., the silicone rubber composition being made of 100 mass part of fluorosilicone rubber (X36-420U manufactured by Shin-Etsu Chemical. Co., Ltd.) and 30 mass parts of barium titanate (208108 manufactured by Si ma-Aldrich Corporation). Furthermore, a surface modification treatment and a deactivation treatment were applied to the precursor of the intermediate layer, and the PET film was then removed, so that the intermediate layer was obtained.

(Surface Modification Treatment)

As the surface modification treatment, a plasma treatment was applied with the following conditions (treatment conditions: PR-500 manufactured by Yamato Scientific Co., Ltd.; an output of 100 W; a treatment period of three minutes; a reaction atmosphere containing 99.999% Argon; and a reaction pressure of 10 Pa).

(Deactivation Treatment)

After the surface modification treatment, solution containing 0.1% fluorinated carbon compound (OPTOOL DSX manufactured by Daikin Industries, Ltd.) and having perfluorohexane as a diluent is applied to a treated surface of the precursor of the intermediate layer through a dip process at a withdrawing speed of 10 mm/min. Thereafter, the deactivation treatment was applied in a manner such that the precursor was left for 30 minutes or longer in an environment having a relative humidity of 90% and a temperature of 60° C., and was then dried for 10 minutes at 50° C.

The intermediate layer was stuck onto the other substrate (a second substrate). Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other and were fixed to each other by being bonded together by means of an adhesive agent, so that the input element as Example 6 was fabricated.

<Evaluation>

With respect to the input element fabricated as Example 6, output voltage was evaluated in the same manner as with respect to Example 1. Table 1 provides the result.

While having a difference with Example 1 in terms of material of the intermediate layer, this input element was found to have higher sensitivity to pressing force than Comparative Example 1.

Example 7

<Preparation of Input Element>

Two polycarbonate substrates cut out into a size of 60 mm×60 mm each having a silver electrode formed thereon in stripe-like shapes having L/S=6 mm/2 mm were prepared. In the procedure performed thereafter, an input element was fabricated in the same manner as with respect to Example 5 and was entirely coated with polyvinyl chloride (PVC), so that a touchpad was obtained.

<Evaluation>

The fabricated input element was connected to an experimental apparatus and was tested to see whether the input element would identify pressing force as being weak, intermediate, and strong corresponding to three stages obtained by dividing the force of 0 gf to 300 gf into 100-gf ranges. A round columnar metal probe having a diameter of 5 mm, the tip of which has a 5-mm-thick silicone sponge (a product of Sunpolymer Co., Ltd., the product number of which is Si200) attached thereto, was prepared. The center of the element was pressed with loads randomly set between 0 to 300 g by a computer program for the experimental apparatus, and input from the touchpad was evaluated. As a result of 1,000 experiments, the input element favorably determined the pressing force to be weak, intermediate, or strong with an error rate of less than 1%.

Example 8

<Fabrication of Display Device Having Input Element>

Two polycarbonate substrates cut out into a size of 50 mm×85 mm each having ITO formed thereon in stripe-like shapes having L/S=6 mm/2 mm were prepared with the stripe-like shapes on one of the substrates arrayed in a direction along the long sides of this substrate and with the stripe-like shapes on the other substrate arrayed in a direction along the short sides of this substrate. In the procedure performed thereafter, an input element was fabricated in the same manner as with respect to Example 1.

The above-described input element was stacked on a 5-inch liquid crystal panel module having no touch panel, so that a liquid crystal display element having an input element was obtained. That is, the configuration of an input device illustrated in FIG. 15A was obtained.

<Evaluation>

The fabricated display element was electrically connected to an experimental apparatus and was evaluated in the same manner as with respect to Example 7. As a result, the input element favorably determined the pressing force to be weak, intermediate, or strong with an error rate of less than 1%.

Example 9

<Fabrication of Display Device Having Input Element>

Two polycarbonate substrates cut out into a size of 50 mm×85 mm each having ITO formed thereon in stripe-like shapes having L/S=6 mm/2 mm were prepared with the stripe-like shapes on one of the substrates arrayed in a direction along the long sides of this substrate and with the stripe-like shapes on the other substrate arrayed in a direction along the short sides of this substrate. In the procedure performed thereafter, an input element was fabricated in the same manner as with respect to Example 5.

A 5-inch liquid crystal panel module was stacked on the above-described input element, so that a liquid crystal display element having an input element was obtained. That is, the configuration of an input device illustrated in FIG. 15B was obtained.

<Evaluation>

The fabricated display element was electrically connected to an experimental apparatus and was evaluated in the same manner as with respect to Example 7. As a result, the input element favorably determined the pressing force to be weak, intermediate, or strong with an error rate of less than 1%.

The fabricated input device was connected to an experimental apparatus and was tested to see whether the input device would identify pressing force as being weak, intermediate, and strong corresponding to three stages obtained by dividing the force of 0 gf to 510 gf into 170-gf ranges. A round columnar metal probe having a diameter of 5 mm, the tip of which has a 5-mm-thick silicone sponge (a product of Sunpolymer Co., Ltd., the product number of which is Si200) attached thereto, was prepared. The center of the element was pressed with loads randomly set between 0 to 510 g by a computer program for the experimental apparatus, and input from the touchpad was evaluated. As a result of 1,000 experiments, the input element favorably determined the pressing force to be weak, intermediate, or strong with an error rate of less than 1%.

Detection Sensitivity

Comparative experiments in consideration of sensitivity (detection speeds) to pressing force were conducted in addition to comparison of magnitudes of output voltage.

Figure 17:
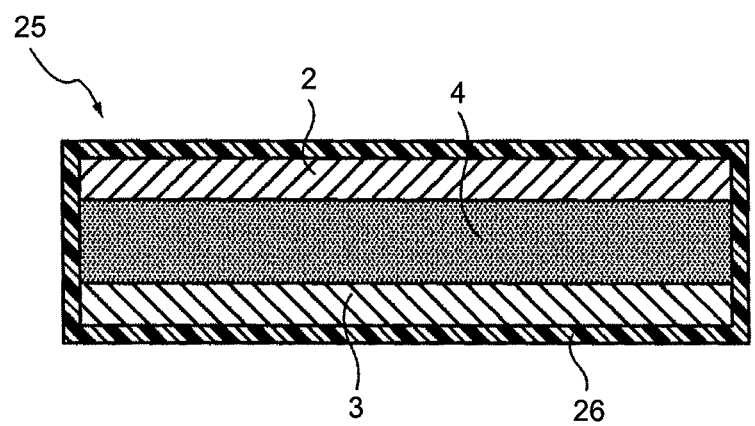
FIG. 17 is a sectional view illustrating the configuration of an input element in a sensitivity evaluation experiment.

FIG. 17 illustrates the configuration of an input element 25 that was used for the comparative experiments. This is a configuration in which the outer surfaces of the input element 1 illustrated in FIG. 1 are covered with a protective cover 26. A comparative example was provided with a configuration having PVDF in place of the intermediate layer 4.

Comparison evaluation was conducted by pressing a probe against the element by use of a tackiness tester and comparing times taken to detect the application of the force.

An evaluation method employed is summarized as performing the following three procedures on each of the input elements and thereby acquiring data.

Figure 18:
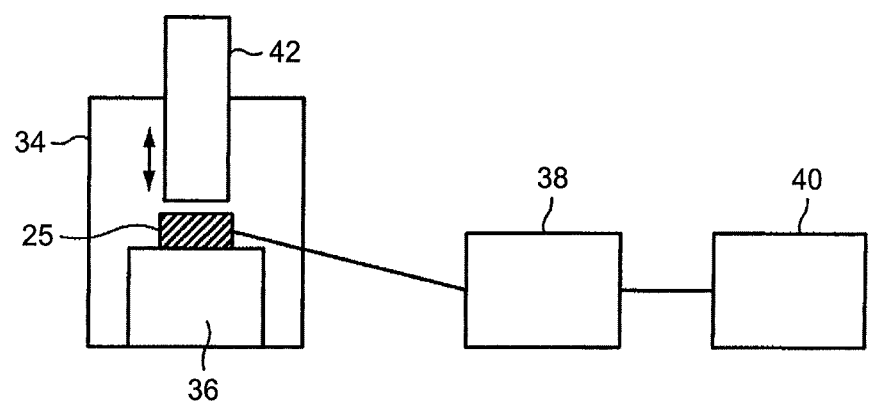
FIG. 18 is a block diagram illustrating the configuration of evaluation of the sensitivity of an input element.

(1) Sticking an input element onto a stage 36 of a tackiness tester 34 and connecting the input element to an oscilloscope 40 via a charge amplifier 38, as illustrated in FIG. 18.

Figure 19:
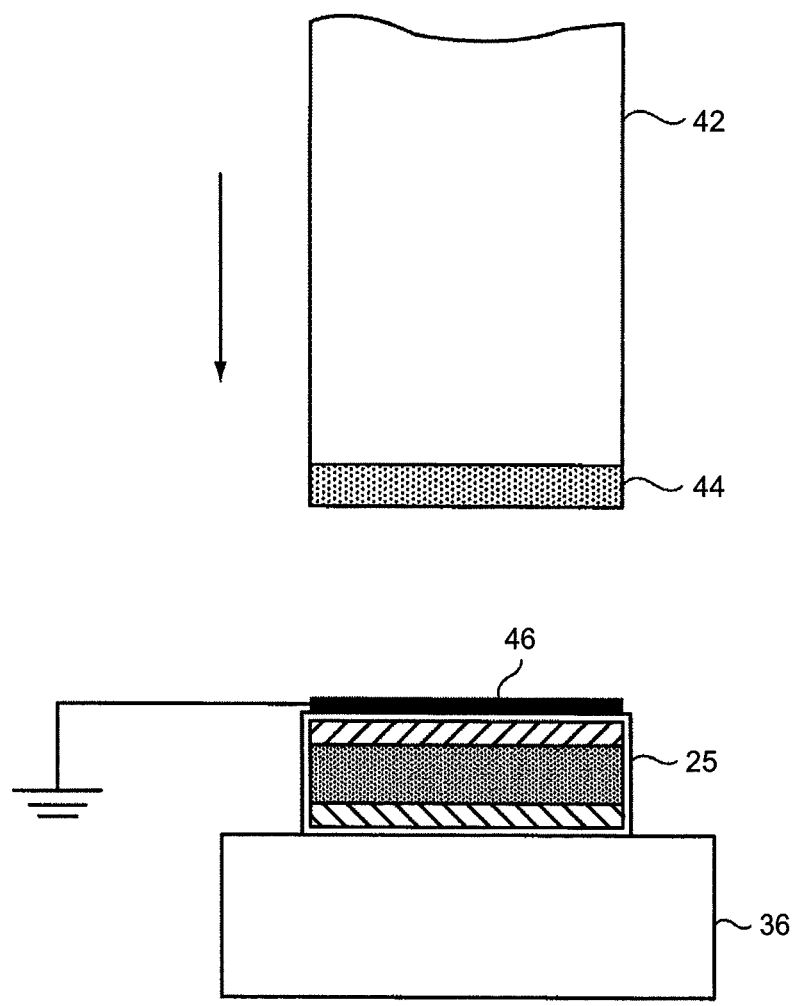
FIG. 19 is a sectional view illustrating a configuration employed by a tackiness tester as evaluation equipment for pressing an input element with a probe.

(2) Attaching a sponge 44 to the tip of a probe 42 and conducting a tackiness test, as illustrated in FIG. 19.

(3) Recording a voltage waveform displayed on the oscilloscope 40, three times repeatedly, to use the average data of the thus recorded three waveforms as an acquired waveform.

Table 2 provides specifications of the compared input elements; Table 3 provides specifications of the sponge used in evaluation; Table 4 provides settings for the charge amplifier; Table 5 provides settings for the oscilloscope; and Table 6 provides evaluation conditions of the tackiness tester.

As provided in Table 2, while the Young's modulus of the PVDF was 2 GPa, the Young's modulus of the intermediate layer 4 in the input element according to this embodiment was 0.01 GPa.

TABLE 2

| Evaluated Input Element | PVDF | Present invention |
|---|---|---|
| Type | Piezoelectric film sensor | Rubber composition |
| Manufacturer | Tokyo Sensor Co., Ltd. | |
| Model Number | DT1-52K/L | |
| Size | 30 mm × 12 mm | 18 mm × 18 mm |
| Thickness | 52 μm | 100 μm |
| Electrode | Ag | Conductive cloth manufactured by Seiren Co., Ltd. |
| Protective Cover | Acrylic | PET |
| Thickness of Entire Element | 70 μm | 390 μm |
| Hardness (Young's Modulus) | 2 GPa | 0.01 Gpa |

TABLE 3

| Sponge Attached to Probe | |
|---|---|
| Material | Silicone Rubber |
| Model Number | Si200 |
| Manufacturer | Sunpolymer Co., Ltd. |
| Name | Minute-Cell Silicone Sponge |

TABLE 3-continued

Sponge Attached to Probe

| | |
|---|---|
| Size | Φ10 mm |
| Thickness | 5 mm |
| Slice Hardness (Type E) | 15 |

TABLE 4

Charge Amplifier Settings

| | |
|---|---|
| Apparatus Name | Charge Amp |
| Apparatus Model Number | 40018-50 |
| Manufacturer | Showa Sokki Corporation |
| PU sens (pC/Unit) | 9.99 |
| Cumulative Length | Short |
| Range (unit/vVolt) | 50 |

TABLE 5

Oscilloscope settings

| | |
|---|---|
| Triger (V) | 0.4 |
| Vertical Scale (V) | 2 |
| Horizontal Scale (sec) | 0.25 |
| Model Number | WaveAce1001 |
| Serial Number | LCRY2150C00538 |
| Software Version | 5.01.02.27 |
| Record Length | 11250 |
| Sample Interval (sec) | CHI: 0.0004 |

TABLE 6

Measurement Conditions for Tackiness Taster

| | |
|---|---|
| Apparatus Name | Fixing Simulator |
| Apparatus Model Number | FSR-1000 |
| Manufacturer | Rhesca |
| Patterns | 5 (Weighting control) |
| Pressing Speed (mm/sec) | 5 |
| Pressing Weight (gf) | 372 |
| Probe Diameter (mm) | 10 |
| Touch Detection Level (gf) | 20 |
| Pressing Stress (Mpa) | 0.05 |
| Pressing Duration (sec) | 1 |
| Pulling Speed (mm/sec) | 5 |
| Final Pulling Distance (mm) | 3 |
| Plate Temperature (° C.) | 25 |

As illustrated in FIG. 19, generation of noise due to unwanted electric charge was prevented by disposing a tape 46 made of aluminum on an upper surface of the input element. The same was applied to measurement for the input element including PVDF and used as a comparison subject.

Figure 20:
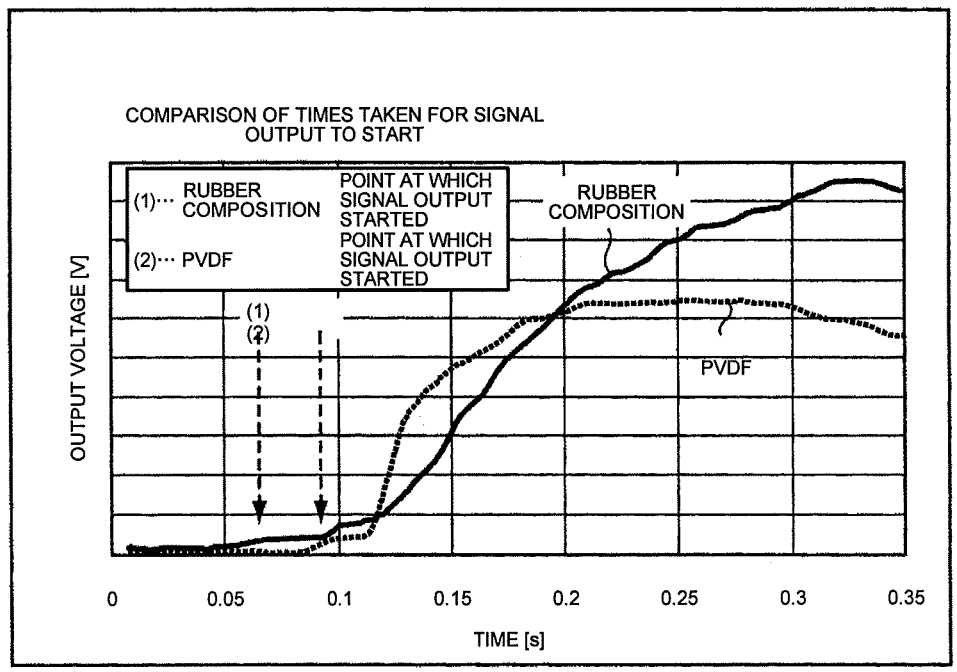
FIG. 20 is a graph of experimental data in an experiment that compared times taken for signal output to start.
Figure 21:
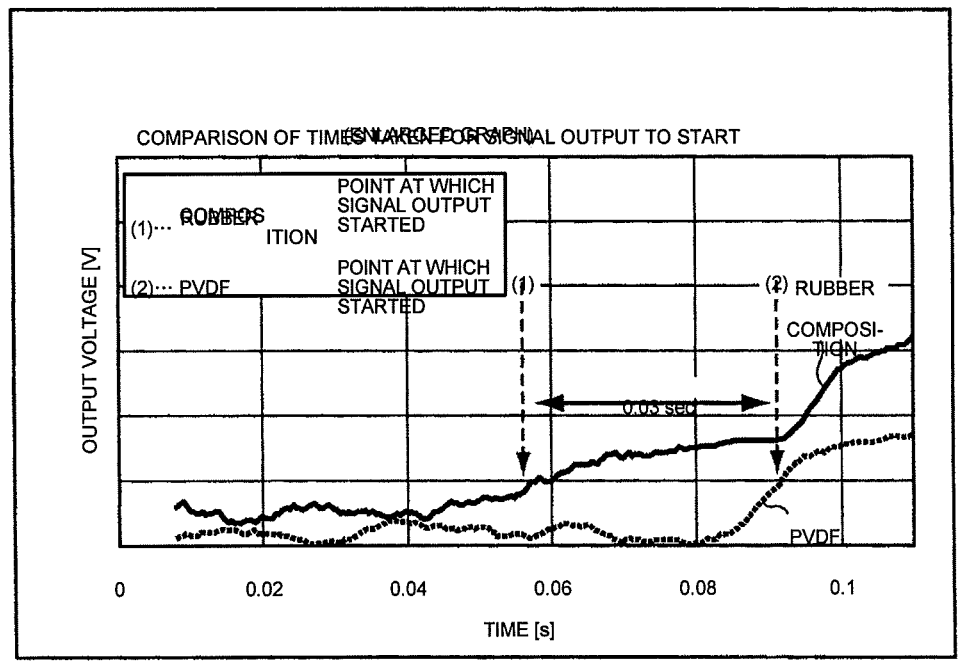
FIG. 21 is an enlarged graph of a part that includes the times when signal output was started in FIG. 20.

The comparison results were illustrated in FIG. 20, and FIG. 21, which enlarges a part of FIG. 20. In the case of the input element according to this embodiment that includes the intermediate layer 4 made of a rubber composition, output of a voltage signal started about 0.01 sec (10 msec) after the sponge 44 attached to the probe 42 made contact with the input element.

In contrast, output started about 0.04 sec (40 msec) after in the case of the input element including PVDF. That is, that input element had a delay that is about 0.03 sec (30 msec) longer than the input element according to this embodiment.

The reason for having such a large delay in sensitivity of the input element is that, because PVDF had a larger value of the Young's modulus as described above and was harder than the intermediate layer 4, it took more time for output of a voltage signal to start.

The sponge 44 was attached to the tip of the probe 42 as described above for the purpose of proving that the input element according to the present invention is highly sensitive even when being touched by a soft object, in other words, that the input element allows reliable input with light-touch operations.

Here, the origin of the times taken for output of a voltage signal to start was set to a time detected by a force sensor installed to the base end of the probe 42 of the tackiness tester 34.

Figure 22:
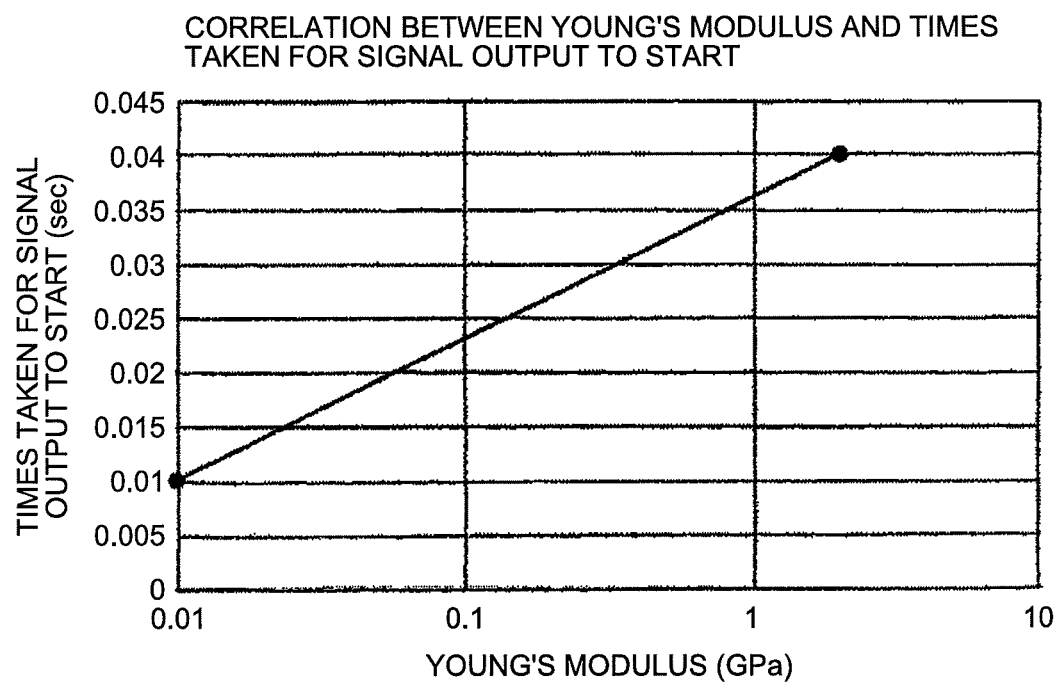
FIG. 22 is a graph representing the correlation between the Young's modulus and times taken for signal output to start.

FIG. 22 is a chart plotting the correlation between the Young's modulus measured of the intermediate layer 4 according to the embodiment and PVDF and times taken for signal output to start. It was confirmed that the Young's modulus of the intermediate layer and the times taken for signal output to start have a linear correlation.

Here, as the Young's modulus of the intermediate layer 4, values obtained by converting hardness at the depth of 10 μm after measuring the hardness using the measuring instrument (a microhardness tester WIN-HUD manufactured by Fischer) used to measure hardness in the detailed description of the above-described rubber composition and the measurement conditions therefore.

As described above, employment of the configuration of the input element according to the present invention lowers the lower limit of detection of touching force (contact force). That is, this configuration allows for detection of a lightly pressing operation made with a finger, and thereby can eliminate inconvenience due to, for example, the necessity of performing what is called a twice-pressing operation, thus enabling comfortable and intuitive operations. This allows for provision of an input element that can be used for a long time period without giving fatigue.

A conventional input element employing PVDF or the like provides relatively small output in response to pressing force and is often configured to perform signal amplification. The input element according to the present invention provides large output and does not need amplification, thereby being capable of enabling a function through a simpler process.

In recent years, in line with diversification of information that is input to the above-described electronic apparatus such as a smartphone, a technique to detect not only positional information but also the magnitude of contact force (pressing force) has been proposed.

The capability to input a position and pressing force can enhance operability, for example, by allowing for use of multiple commands depending on how strongly or weakly the same position is touched, input of a character or drawing with writing pressure reflected, and the like.

In this case, while distinctively distinguishing differences in (how strong or weak) pressing force is needed, an input element employing PVDF has lower sensitivity to pressing force and therefore has not been capable of satisfactorily providing enhanced operability and functionality by distinguishing differences in pressing force.

As the above sensitivity experiment clearly indicates, the input element according to the present invention has a small detection limit, thus being capable of distinctively distinguishing differences in pressing force. That is, a less time taken for output to start than in the case of the example including PVDF as illustrated in FIG. 20 and FIG. 21 means a larger range of sensitivity to pressing force, and a margin of accuracy for less ambiguous multi-stage detection. This characteristic brings about the results for Examples 7 to 9.

In addition, the input element according to the present invention also has high load durability, thereby being capable of detecting a wide range from weak force to strong force. This allows for provision of an input element that is capable of multistage determination of how strong or weak the force is and that has high processing capability.

When being used in a stack with a display element, the input element according to the present invention, because of high sensitivity thereof, does not necessarily need to be disposed as the outermost layer (in the operation receiving side), thereby providing enhanced flexibility in terms of configuration of the input element. Furthermore, a material used in the present invention has heat resistance, thereby providing enhanced flexibility in terms of process temperature.

Example 10

<Fabrication of Input Element>

Figure 26:
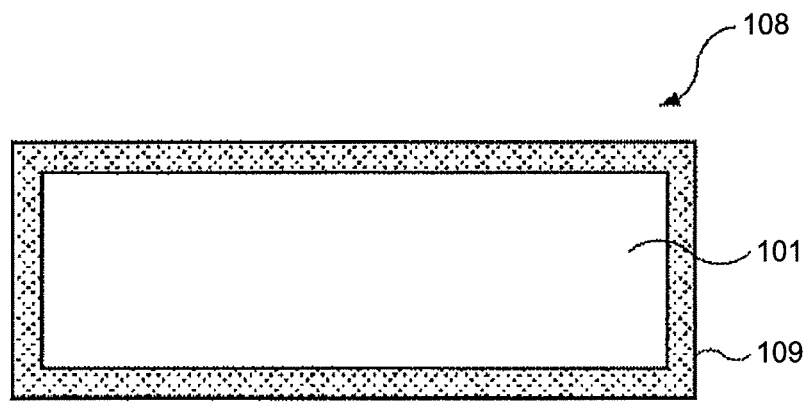
FIG. 26 is a sectional view illustrating the configuration of an input element for a high-temperature load evaluation.

An input element 108 having a sectional structure illustrated in FIG. 26 was fabricated by the following procedure. Note that this input element 108 for high-temperature load evaluation was designed to include the input element 101 and a cover sheet 109 with the input element 101 having a sectional configuration illustrated in FIG. 25B and with the outer surfaces of the input element 101 covered with the cover sheet 109. That is, the entirety of the input element 108 is packaged with the cover sheet 109.

The precursor of an intermediate layer was formed with a thickness of 100 μm in a manner such that a silicone rubber (KE-1935 manufactured by Shin-Etsu Chemical Co., Ltd.) was applied to a surface of a PET film and then thermally cured for 30 minutes at 120° C. Furthermore, a surface modification treatment and a deactivation treatment were applied to the precursor of the intermediate layer, and the PET film was then removed, so that the intermediate layer was obtained.

(Surface Modification Treatment)

As the surface modification treatment, a plasma treatment was applied with the following conditions (treatment conditions: PR-500 manufactured by Yamato Scientific Co., Ltd.; an output of 100 W; a treatment period of three minutes; a reaction atmosphere containing 99.999% Argon; and a reaction pressure of 10 Pa).

(Deactivation Treatment)

After the surface modification treatment, solution containing 0.1% fluorinated carbon compound (OPTOOL DSX manufactured by Daikin Industries, Ltd.) and having perfluorohexane as a diluent was applied to a treated surface of the precursor of the intermediate layer through a dip process at a pulling speed of 10 mm/min. Thereafter, the deactivation treatment was applied in a manner such that the precursor was left for 30 minutes or longer in an environment having a relative humidity of 90% and a temperature of 60° C. and then dried for 10 minutes at 50° C.

Subsequently, two objects were prepared each including: a PET substrate cut out into a size of 40 mm×40 mm; and an ITO electrode formed thereon in stripe-like shapes having L/S=8 mm/2 mm.

A film spacer (U34 Lumirror #50 manufactured by Toray Industries, Inc., having a thickness of 50 μm) was fixed on an electrode-mounted surface of one (a first substrate) using a double-sided adhesive tape (TRAN-SIL NT-1001 manufactured by Taiyo Wire Cloth Co., Ltd., having a thickness of 50 μm) so as to be in stripe-like shapes having L/S=1 mm/9 mm.

A conductive double-sided adhesive tape (CHO-FOIL CCD manufactured by Taiyo Wire Cloth Co., Ltd., having a thickness of 112 μm) and the intermediate layer are laid and stuck in this order on an electrode-mounted surface of the second substrate.

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other, and were fixed to each other by being bonded together by means of a double-sided adhesive tape (TRAN-SIL NT-1001 manufactured by Taiyo Wire Cloth Co., Ltd., having a thickness of 50 μm), so that the input element as Example 10 was fabricated.

<Evaluation>

The detection sensitivity of the fabricated input element to pressing force was evaluated. The evaluation was conducted by the following procedure. Table 7 provides the result. In a column named Input Element in Table 7, "FIG. 26/FIG. 25B" indicates that an input element having a sectional structure illustrated in FIG. 25B is packaged as illustrated in FIG. 26.

The sectional configuration of an input element provided as Example 15 is as illustrated in FIG. 23.

The sectional configuration of input elements provided as Example 16 and Example 17 are as illustrated in FIG. 25A.

The sectional configuration of an input element provided as Example 18 is as illustrated in FIG. 24B.

The sectional configuration of an input element provided as Example 19 is as illustrated in FIG. 1 and has a configuration obtained by packaging one of the basic configurations according to the present invention that includes no heat-resisting layer.

As Table 7 clearly indicates, the input element as Example 10 was found to have higher detection sensitivity without any high-temperature load applied thereto than Comparative Example 2.

(Evaluation Procedure)

Figure 27:
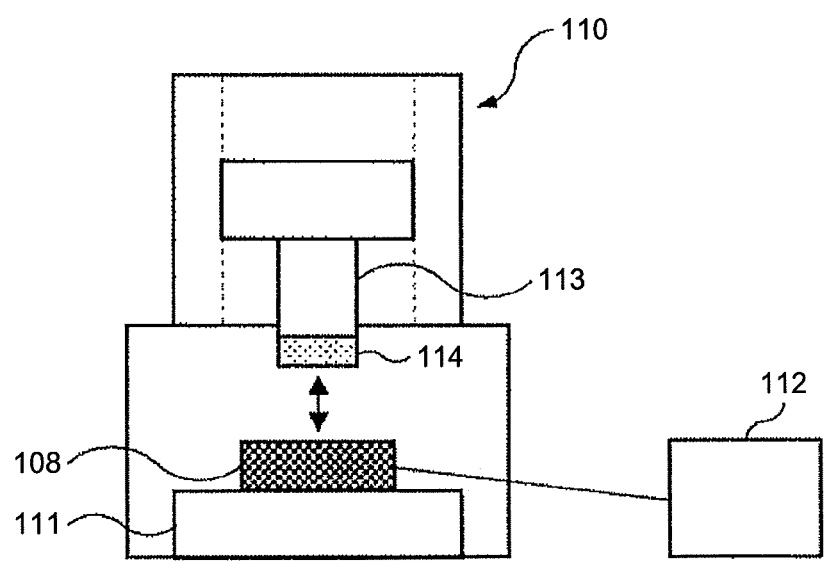
FIG. 27 is a block diagram illustrating the configuration of evaluation of the detection sensitivity of the input element input element for a high-temperature load evaluation.

(1) Fixing the input element 108 for high-temperature load evaluation onto a stage 111 of a measuring instrument 110 and connecting the input element 108 to an oscilloscope 112, as illustrated FIG. 27.

(2) Attaching a sponge 114 to the tip of a probe 113 and pressing this sponge 114 to a position at which the center of the sponge 114 coincides with the intersection of the first and the second electrodes.

(3) Recording output voltage displayed on the oscilloscope 112, five times repeatedly, to use the average of values of output voltage from five measurements.

(4) Obtaining a multiplying factor thereof against output voltage of Comparative Example 2 to be described later and determining the ranking of detection sensitivity.

{Conditions for Measuring Output Voltage}

Measuring instrument: A fixing simulator FSR-1000 (manufactured by Rhesca Co., Ltd.)

Measuring pattern: Load control

Pressing speed: 5 mm/sec

Pressing load: 300 gf

Pressing retention duration: 1 sec

Pulling speed: 5 mm/sec

Probe diameter: 10 mm in diameter

Sponge: A silicone sponge with hardness 15, a diameter of 10 mm, and a thickness of 5 mm Oscilloscope: WaveAce1001 (manufactured by LeCroy)

{Criteria for Evaluation of Detection Sensitivity}

Rank A: Output voltage five or more times as high as that of Comparative Example 2

Rank B: Output voltage three or more times as high as that of Comparative Example 2

Rank C: Output voltage higher than or as high as that of Comparative Example 2

Rank D: Output voltage lower than that of Comparative Example 2

Example 11

<Fabrication of Input Element>

An input element as Example 11 was fabricated in the same manner as the input element as Example 10 except that, in the input element as Example 10, a high-temperature load was applied to the intermediate layer. That is, an input element having a sectional structure indicated by FIG. 26/FIG. 25B was fabricated.

(High-Temperature Load)

The high-temperature load was applied in a manner such that the intermediate layer was held for 24 hours in an incubator (DN410H manufactured by Yamato Scientific Co., Ltd.) at a temperature of 150° C. Thereafter, the intermediate layer was left to stand still for 24 hours under the conditions of 24° C. and 40 RH %.

<Evaluation>

With respect to the input element fabricated as Example 11, detection sensitivity to pressing force was evaluated in the same manner as with respect to Example 10. Table 7 provides the result.

As Table 7 clearly indicates, the intermediate layer in Example 11 had the lower sensitivity thereof decreased after the application of the high-temperature load but had higher detection sensitivity than Comparative Example 2, thereby being found to have sufficient heat resistance.

That is, while the input element as Comparative Example 2 had a decrease as high as 80° in detection sensitivity after the high-temperature load, the input element as Example 11 had a decrease of as low as a little smaller than 30%. This indicates the ability to sufficiently tolerate changes in the environment such as an increase in temperature inside a vehicle (retain the rank of A or B) and contribute to enhancing the operability of an electronic apparatus such as a smartphone.

Example 12

<Fabrication of Input Element>

An input element as Example 12 was fabricated in the same manner as the input element as Example 10 except that, in the input element as Example 10, the electrode-mounted surface of the second substrate and the intermediate layer were thermally bonded together by use of a conductive adhesive agent (TB3303B manufactured by ThreeBond Co., Ltd., having a thickness of 50 μm with bonding conditions of 150° C. and a one-hour duration). That is, an input element having a sectional structure indicated by FIG. 26/FIG. 25B was fabricated.

<Evaluation>

With respect to the input element fabricated as Example 12, detection sensitivity to pressing force was evaluated in the same manner as with respect to Example 10. Table 7 provides the result.

As Table 7 clearly indicates, the intermediate layer in Example 12 had the detection sensitivity thereof decreased after the high-temperature load but had higher detection sensitivity than Comparative Example 2, thereby being found to have sufficient heat resistance. Thus, heating adhesion is allowed in the course of manufacturing an input element. As a result of heating adhesion allowed in the course of manufacturing an input element, not only manufacturing precision that leads to high reliability can be enhanced but also problems, such as deterioration of output, attributable to signal offset due to mismatched phases after manufacture thereof can be prevented.

Example 13

<Fabrication of Input Element>

An input element was fabricated as Example 13 by applying a high-temperature load to the input element as Example 10.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 13, detection sensitivity to pressing force was evaluated in the same manner as with respect to Example 10. Table 7 provides the result.

As Table 7 clearly indicates, the input element as Example 13 had the detection sensitivity thereof decreased after the high-temperature load, but had higher detection sensitivity than Comparative Example 2, thereby being found to have sufficient heat resistance. Thus, the input element according to the present invention can be used in a high-temperature environment.

Example 14

<Fabrication of Input Element>

An input element was fabricated as Example 14 by applying a high-temperature load to the input element as Example 12.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 14, detection sensitivity to pressing force was evaluated in the same manner as with respect to Example 10. Table 7 provides the result.

As Table 7 clearly indicates, the input element as Example 14 maintained high detection sensitivity thereof even after the high-temperature load, thereby being found to have sufficient heat resistance. Thus, the input element according to the present invention can be used in a high-temperature environment.

Example 15

<Fabrication of Input Element>

An input element as Example 15 was fabricated in the same manner as the input element as Example 12 except that, in the input element as Example 12, the adhesive layer and any of the spacers were not provided on the electrode-mounted surface of the first substrate. That is, an input element having a sectional structure indicated by FIG. 26/FIG. 23 was fabricated. Furthermore, a high-temperature load was applied to the input element.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 15, detection sensitivity to pressing force was evaluated in the same manner as with respect to Example 10. Table 7 provides the result.

As Table 7 clearly indicates, the input element as Example 15 had lower detection sensitivity than the input element that includes spacers but was found to have higher detection sensitivity than Comparative Example 2. In other words, by having a gap provided between the electrode and the intermediate layer or having the electrode and the intermediate layer not bonded to each other, the input element can facilitate occurrence of triboelectric charging or abrasion charging and accordingly provide a large electric signal.

For the input element as Electrode 15, as Table 7 clearly indicates, the packaged input element was heated after the intermediate layer and the electrode were thermally bonded together. That is, the input element was exposed to a high-temperature load after the manufacturing precision thereof was improved. This input element has an output-voltage multiplying factor of 4, which is a lower value than those of the other Examples, but still has high detection sensitivity, which is twice as high as that of the case including no heat-resisting layer (Example 19).

Example 16

<Fabrication of Input Element>

An input element 108 having a sectional structure illustrated in FIG. 26 was fabricated by the following procedure. Note that this input element 108 for high-temperature load evaluation was designed to include the input element 101 and the cover sheet 109 with the input element 101 having a sectional configuration illustrated in FIG. 25A and with the outer surfaces of the input element 101 covered with the cover sheet 109.

The precursor of an intermediate layer was formed with a thickness of 100 μm in a manner such that, after a silicone rubber composition was applied to a surface of a PET film, the substrate was thermally cured for 30 minutes at 120° C., the silicone rubber composition being made of 100 mass parts of silicone rubber (TSE3033 manufactured by Momentive Performance Materials Japan LLC) and 10 mass parts of silica (R972 manufactured by Nippon Aerosil Co., Ltd.). Furthermore, a surface modification treatment was applied to the precursor of the intermediate layer, and the PET film was then removed, so that the intermediate layer was obtained.

(Surface Modification Treatment)

As the surface modification treatment, a corona discharge treatment was applied with the following conditions (treatment conditions: applied voltage of 100 V; cumulative energy of 60 J/cm$^2$; and a reaction atmosphere of air).

Subsequently, two objects were prepared each including: a PET substrate cut out into a size of 40 mm×40 mm; and an ITO electrode formed thereon in stripe-like shapes having L/S=8 mm/2 mm.

A spacer spray solution obtained by dispersing spherical silica particles serving as spacers and having a diameter of 10 μm in isopropyl alcohol was sprayed onto an electrode-mounted surface of the first substrate by use of a spin-coating machine. Then, the spacer spray solution was dried, so that spacers were formed on the electrode-mounted surface of the first substrate.

A conductive adhesive agent (TB3303B manufactured by ThreeBond Co., Ltd., having a thickness of 50 μm) and the intermediate layer were stacked in this order on an electrode-mounted surface of the second substrate and thermally bonded together for one hour at 150° C.

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other, and were fixed to each other by being bonded together by means of a double-sided adhesive tape (TRANSIL NT-1001 manufactured by Taiyo Wire Cloth Co., Ltd., having a thickness of 50 μm), so that the input element as Example 16 was fabricated. Furthermore, a high-temperature load was applied to the input element.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 16, detection sensitivity to pressing force was evaluated in the same manner as with respect to Example 10. Table 7 provides the result.

As Table 7 clearly indicates, the input element as Example 16 was found to have high detection sensitivity even after the high-temperature load.

Example 17

<Fabrication of Input Element>

An input element 108 having a sectional structure illustrated in FIG. 26 was fabricated by the following procedure. Note that this input element 108 for high-temperature load evaluation was designed to include the input element 101 and the cover sheet 109 with the input element 101 having a sectional configuration illustrated in FIG. 25A and with the outer surfaces of the input element 101 covered with the cover sheet 109.

The precursor of an intermediate layer was formed with a thickness of 100 μm in a manner such that a silicone rubber composition was applied to a surface of a PET film and then thermally cured for 30 minutes at 120° C., the silicone rubber composition being made of fluorosilicone rubber (X36-420U manufactured by Shin-Etsu Chemical Co., Ltd.) and 30 mass parts of barium titanate (208108 manufactured by Sigma-Aldrich Corporation). Furthermore, a surface modification treatment was applied to the precursor of the intermediate layer, and the PET film was then removed, so that the intermediate layer was obtained.

(Surface Modification Treatment)

As the surface modification treatment, a UV irradiation treatment was applied with the following conditions (treatment conditions: VL-215.0 manufactured by Vilber Lourmat; a wavelength of 254 nm; a cumulative light quantity of 300 J/cm$^2$; and a reaction atmosphere of nitrogen with an oxygen partial pressure of 5,000 ppm or lower).

Subsequently, two objects were prepared each including: a PET substrate cut out into a size of 40 mm×40 mm; and an ITO electrode formed thereon in stripe-like shapes having L/S=8 mm/2 mm.

A spacer spray solution obtained by dispersing spherical silica particles serving as spacers and having a diameter of 10 µm in isopropyl alcohol was sprayed onto an electrode-mounted surface of the first substrate by use of a spin-coating machine. Then, the spacer spray solution was dried, so that spacers were formed on the electrode-mounted surface of the first substrate.

A conductive adhesive agent (TB3303B manufactured by ThreeBond Co., Ltd., having a thickness of 50 µm) and the intermediate layer were stacked in this order on an electrode-mounted surface of the second substrate and thermally bonded together for one hour at 150° C.

Each electrode on the first and the second substrates was connected to an extraction electrode.

The two substrates were then laid on top of each other with the electrode-mounted surface of the first substrate and the intermediate layer on the second substrate facing each other and with the directions (longitudinal directions) of stripes of the respective electrodes being perpendicular to each other, and were fixed to each other by being bonded together by means of a double-sided adhesive tape (TRANSIL NT-1001 manufactured by Taiyo Wire Cloth Co., Ltd., having a thickness of 50 µm), so that the input element as Example 17 was fabricated. Furthermore, a high-temperature load was applied to the input element.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 17, detection sensitivity to pressing force was evaluated in the same manner as with respect to Example 10. Table 7 provides the result.

As Table 7 clearly indicates, the input element as Example 17 was found to have high detection sensitivity even after the high-temperature load.

Example 18

<Fabrication of Input Element>

An input element 108 having a sectional structure illustrated in FIG. 26 was fabricated by the following procedure. Note that this input element 108 for high-temperature load evaluation was designed to include the input element 101 and the cover sheet 109 with the input element 101 having the sectional configuration illustrated in FIG. 24B and with the outer surfaces of the input element 101 covered with the cover sheet 109.

The precursor of an intermediate layer was formed with a thickness of 100 µm in a manner such that a silicone rubber composition was applied to a surface of a PET film and then thermally cured for 30 minutes at 120° C., the silicone rubber composition being made of silicone rubber (KE-1935 manufactured by Shin-Etsu Chemical Co., Ltd.) and 50 mass parts of barium titanate (208108 manufactured by Sigma-Aldrich Corporation). Furthermore, a surface modification treatment was applied to the precursor of the intermediate layer, and the PET film was then removed, so that the intermediate layer was obtained.

(Surface Modification Treatment)

As the surface modification treatment, an electron beam irradiation treatment was applied with the following conditions (treatment conditions: a linear-irradiation type low-energy electron beam irradiation source manufactured by Hamamatsu Photonics K.K.; an irradiation quantity of 1 MGy; and a reaction atmosphere of nitrogen with an oxygen partial pressure of 5,000 ppm or lower).

Subsequently, two objects were prepared each including: a PET substrate cut out into a size of 40 mm×40 mm; and an ITO electrode formed thereon in stripe-like shapes having L/S=8 mm/2 mm.

A conductive adhesive agent (STAYSTIK571 manufactured by Alpha Advanced Materials, having a thickness of 76 µm), the intermediate layer, an adhesive agent (STAYSTIK472 manufactured by Alpha Advanced Materials, having a thickness of 76 µm), and the electrode-mounted surface of the first substrate were stacked in this order on an electrode-mounted surface of the second substrate and thermally bonded together for 10 minutes at 160° C. Note that they were stacked on each other with the electrode-mounted surface of the first substrate and the intermediate layer on the second substrate facing each other and with the directions (longitudinal directions) of stripes of the respective electrodes being perpendicular to each other.

Each electrode on the first and the second substrates was connected to an extraction electrode.

The input element as Example 18 was fabricated in the above described manner. Furthermore, a high-temperature load was applied to the input element.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 18, detection sensitivity to pressing force was evaluated in the same manner as with respect to Example 10. Table 7 provides the result.

As Table 7 clearly indicates, the input element as Example 18 was found to have high detection sensitivity even after the high-temperature load.

Example 19

<Fabrication of Input Element>

An input element 108 having a sectional structure illustrated in FIG. 26 was fabricated by the following procedure. Note that this input element 108 for high-temperature load evaluation was designed to include the input element 101 and the cover sheet 109 with the input element 101 having the sectional configuration illustrated in FIG. 1 and with the outer surfaces of the input element 101 covered with the cover sheet 109. That is, this configuration was obtained by packaging one of the basic configurations according to the present invention that includes no heat-resisting layer.

The precursor of an intermediate layer was formed with a thickness of 100 μm in a manner such that a silicone rubber (KE-1935 manufactured by Shin-Etsu Chemical Co., Ltd.) was applied to a surface of a PET film and then thermally cured for 30 minutes at 120° C. Furthermore, a surface modification treatment and a deactivation treatment were applied to the precursor of the intermediate layer, and the PET film was then removed, so that the intermediate layer was obtained.

(Surface Modification Treatment)

As the surface modification treatment, a plasma treatment was applied with the following conditions (treatment conditions: PR-500 manufactured by Yamato Scientific Co., Ltd.; an output of 100 W; a treatment period of three minutes; a reaction atmosphere containing 99.999% Argon; and a reaction pressure of 10 Pa).

(Deactivation Treatment)

After the surface modification treatment, a solution containing 0.1% fluorinated carbon compound (OPTOOL DSX manufactured by Daikin Industries, Ltd.) and having perfluorohexane as a diluent was applied to a treated surface of the precursor of the intermediate layer through a dip process at a pulling speed of 10 mm/min. Thereafter, the deactivation treatment was applied in a manner such that the precursor was left for 30 minutes or longer in an environment having a relative humidity of 90% and a temperature of 60° C. and then dried for 10 minutes at 50° C.

Subsequently, two objects were prepared each including: a PET substrate cut out into a size of 40 mm×40 mm; and an ITO electrode formed thereon in stripe-like shapes having L/S=8 mm/2 mm.

The intermediate layer and an electrode-mounted surface of the first substrate were stacked in this order on an electrode-mounted surface of the second substrate and were fixed by means of a double-sided adhesive tape (TRAN-SIL NT-1001 manufactured by Taiyo Wire Cloth Co., Ltd., having a thickness of 50 μm). Note that they were stacked on each other with the electrode-mounted surface of the first substrate and the intermediate layer on the second substrate facing each other and with the directions (longitudinal directions) of stripes of the respective electrodes being perpendicular to each other.

Each electrode on the first and the second substrates was connected to an extraction electrode.

The input element as Example 19 was fabricated in the above described manner. Furthermore, a high-temperature load was applied to the input element.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Example 19, detection sensitivity to pressing force was evaluated in the same manner as with respect to Example 10. Table 7 provides the result.

As Table 7 clearly indicates, the input element as Example 19 was found to have the detection sensitivity thereof decreased even after the high-temperature load as compared to the input elements according to the embodiments of the present invention that each include a heat-resisting layer. However, this input element still had detection sensitivity of 10 times as high as Comparative example 5 by including the intermediate layer according to the present invention.

Comparative Example 2

<Fabrication of Input Element>

An input element as Comparative Example 2 was fabricated in the same manner as the input element as Example 10 except that, in the input element as Example 10, the intermediate layer was replaced with PVDF (manufactured by Tokyo Sensor Co., Ltd. and having a thickness of 110 μm). That is, an input element having a sectional structure indicated by FIG. 26/FIG. 25B was fabricated.

<Evaluation>

With respect to the input element fabricated as Comparative Example 2, detection sensitivity to pressing force was evaluated in the same manner as with respect to Example 10. Table 7 provides the result.

As Table 7 clearly indicates, the input element as Example 2 was found to have lower detection sensitivity than the input element according to the present invention when these elements were compared without any high-temperature load applied.

Comparative Example 3

<Fabrication of Input Element>

An input element as Comparative Example 3 was fabricated in the same manner as the input element as Comparative Example 2 except that, in the input element as Comparative Example 2, a high-temperature load was applied to the intermediate layer. That is, an input element having a sectional structure indicated by FIG. 26/FIG. 25B was fabricated.

(High-Temperature Load)

The high-temperature load was applied in a manner such that the intermediate layer was held for 24 hours in an incubator (DN410H manufactured by Yamato Scientific Co., Ltd.) at a temperature of 150° C. Thereafter, the intermediate layer was left to stand still for 24 hours under the conditions of 24° C. and 40 RH %.

<Evaluation>

With respect to the input element fabricated as Comparative Example 3, detection sensitivity to pressing force was evaluated in the same manner as with respect to Example 10. Table 7 provides the result.

As Table 7 clearly indicates, the intermediate layer in Comparative Example 3 was found to have the detection sensitivity thereof substantially decreased after the high-temperature load. This indicates the inability to tolerate changes in the environment such as an increase in temperature inside a vehicle under the blazing sun, and the possibility of becoming inoperable in some cases.

Comparative Example 4

<Fabrication of Input Element>

An input element as Comparative Example 4 was fabricated in the same manner as the input element as Comparative Example 2 except that, in the input element as Comparative Example 2, the electrode-mounted surface of the second substrate and the intermediate layer were thermally bonded together by use of a conductive adhesive agent (TB3303B manufactured by ThreeBond Co., Ltd., having a thickness of 50 μm with bonding conditions of 150° C. and a one-hour duration). That is, an input element having a sectional structure indicated by FIG. 26/FIG. 25B was fabricated.

<Evaluation>

With respect to the input element fabricated as Comparative Example 4, detection sensitivity to pressing force was evaluated in the same manner as with respect to Example 10. Table 7 provides the result.

As Table 7 clearly indicates, the intermediate layer in Comparative Example 4 was found to have the detection sensitivity thereof substantially decreased after the high-temperature load.

Comparative Example 5

<Fabrication of Input Element>

An input element was fabricated as Comparative Example 5 by applying a high-temperature load to the input element as Comparative Example 2.

(High-Temperature Load)

The high-temperature load was applied in a manner such that the input element was held for one hour in an incubator (DN410H manufactured by Yamato Scientific Co., Ltd.) having a temperature of 150° C. Thereafter, the input element was left to stand still for one hour under the conditions of 24° C. and 40 RH %.

<Evaluation>

With respect to the input element fabricated as Comparative Example 5, detection sensitivity to pressing force was evaluated in the same manner as with respect to Example 10. Table 7 provides the result.

As Table 7 clearly indicates, the input element as Comparative Example 5 was found to have the detection sensitivity thereof substantially decreased after the high-temperature load.

Table 8 provides positions having the heat-resisting layers 105 in Table 7 disposed therein and details of the materials thereof.

TABLE 8

| | Intermediate layer | | | |
|---|---|---|---|---|
| | Placement | Category | Material | Thickness |
| Example 10 | Between first electrode and spacer | Double-sided adhesive tape | Silicone-based | 50 μm |
| | Between intermediate layer and second electrode | Double-sided adhesive tape (conductive) | Copper foil/ conductive acrylic | 112 μm |
| Example 11 | Between first electrode and spacer | Double-sided adhesive tape | Silicone-based | 50 μm |
| | Between intermediate layer and second electrode | Double-sided adhesive tape (conductive) | Copper foil/ conductive acrylic | 112 μm |
| Example 12 | Between first electrode and spacer | Double-sided adhesive tape | Silicone-based | 50 μm |
| | Between intermediate layer and second electrode | Thermosetting material (conductive) | Conductive silicone-based | 50 μm |
| Example 13 | Between first electrode and spacer | Double-sided adhesive tape | Silicone-based | 50 μm |

TABLE 7

| | | | Gap Between | | | Detection Sensitivity | |
|---|---|---|---|---|---|---|---|
| | Input Element | Intermediate Layer | Electrode and Intermediate Layer | Heat-Resisting Layer | High-Temperature Load | Output-voltage multiplication factor | Rank determination |
| Example 10 | FIG. 26/ FIG. 25B | Silicone rubber | Present | Present | No heating | 7 | A |
| Example 11 | FIG. 26/ FIG. 25B | Silicone rubber | Present | Present | Heated only intermediate layer | 5 | A |
| Example 12 | FIG. 26/ FIG. 25B | Silicone rubber | Present | Present | Thermally bonded intermediate layer and electrode | 6 | A |
| Example 13 | FIG. 26/ FIG. 25B | Silicone rubber | Present | Present | Heated input element of Example 10 | 5 | A |
| Example 14 | FIG. 26/ FIG. 25B | Silicone rubber | Present | Present | Heated input element of Example 12 | 6 | A |
| Example 15 | FIG. 26/ FIG. 23 | Silicone rubber | Absent | Present | Thermally bonded intermediate layer and electrode and further heated input element | 4 | B |
| Example 16 | FIG. 26/ FIG. 25A | Silicone rubber composition | Present | Present | Thermally bonded intermediate layer and electrode and further heated input element | 6 | A |
| Example 17 | FIG. 26/ FIG. 25A | Silicone rubber composition | Present | Present | Thermally bonded intermediate layer and electrode and further heated input element | 5 | A |
| Example 18 | FIG. 26/ FIG. 24B | Silicone rubber composition | Present | Present | Thermally bonded intermediate layer and electrode and further heated input element | 5 | A |
| Example 19 | FIG. 26/ FIG. 1 | Silicone rubber | Absent | Absent | Heated input element | 2 | C |
| Comparative Example 2 | FIG. 26/ FIG. 25B | PVDF | Present | Present | No heating | 1 (Benchmark) | C |
| Comparative Example 3 | FIG. 26/ FIG. 25B | PVDF | Present | Present | Heated only intermediate layer | 0.2 | D |
| Comparative Example 4 | FIG. 26/ FIG. 25B | PVDF | Present | Present | Thermally bonded intermediate layer and electrode | 0.2 | D |
| Comparative Example 5 | FIG. 26/ FIG. 25B | PVDF | Present | Present | Heated input element of Comparative Example 2 | 0.2 | D |

TABLE 8-continued

| | Intermediate layer | | | |
|---|---|---|---|---|
| | Placement | Category | Material | Thickness |
| Example 14 | Between intermediate layer and second electrode | Double-sided adhesive tape (conductive) | Copper foil/ conductive acrylic | 112 μm |
| | Between first electrode and spacer | Double-sided adhesive tape | Silicone-based | 50 μm |
| | Between intermediate layer and second electrode | Thermosetting material (conductive) | Conductive silicone-based | 50 μm |
| Example 15 | Between intermediate layer and second electrode | Thermosetting material (conductive) | Conductive silicone-based | 50 μm |
| Example 16 | Between intermediate layer and second electrode | Thermosetting material (conductive) | Conductive silicone-based | 50 μm |
| Example 17 | Between intermediate layer and second electrode | Thermosetting material (conductive) | Conductive silicone-based | 50 μm |
| Example 18 | Between first electrode and intermediate layer | Thermoplastic material | Undisclosed | 76 μm |
| | Between intermediate layer and second electrode | Thermosetting material (conductive) | Undisclosed | 76 μm |
| Example 19 | Absent | — | — | — |
| Comparative Example 2 | Between first electrode and spacer | Double-sided adhesive tape | Silicone-based | 50 μm |
| | Between intermediate layer and second electrode | Double-sided adhesive tape (conductive) | Copper foil/ conductive acrylic | 112 μm |
| Comparative Example 3 | Between first electrode and spacer | Double-sided adhesive tape | Silicone-based | 50 μm |
| | Between intermediate layer and second electrode | Double-sided adhesive tape (conductive) | Copper foil/ conductive acrylic | 112 μm |
| Comparative Example 4 | Between first electrode and spacer | Double-sided adhesive tape | Silicone-based | 50 μm |
| | Between intermediate layer and second electrode | Thermosetting material (conductive) | Conductive silicone-based | 50 μm |
| Comparative Example 5 | Between first electrode and spacer | Double-sided adhesive tape | Silicone-based | 50 μm |
| | Between intermediate layer and second electrode | Double-sided adhesive tape (conductive) | Copper foil/ conductive acrylic | 112 μm |

As indicated in Table 8, Example 13 had the intermediate layer 104 and the second electrode 103 bonded together by means of double-sided adhesive tape of a conductive acrylic material therebetween and had the entirety of the input element heated.

Example 14 had the intermediate layer 104 and the second electrode 103 bonded together by means of a thermosetting conductive acrylic material therebetween and had the entirety of the input element heated.

Although having a larger heating load applied thereto, Example 14 had a higher output-voltage multiplying factor than Example 13, which had a lower heating load applied thereto. One possible reason for this is that the material (silicone) for the intermediate layer 104 and the material for the heat-resisting layer 105 in Example 14 have thermal properties that are the same as or equivalent to each other.

That is, this is considered because signal offset or other problems attributable to factors such as boundary separation or mismatched phases caused by the difference in coefficient of thermal expansion due to the high-temperature load can be prevented with high precision.

While the preferred embodiments of the present invention have been described above, the present invention is not limited to such particular embodiments, and, unless otherwise limited in the above description, numerous modifications and changes can be made without departing from the invention herein.

The effects described in the embodiments of the present invention are merely examples of the most preferred effects that the present invention has, and the effects of the present invention are not limited to those described in the embodiments of the present invention.

REFERENCE SIGNS LIST 1, 1', 101 INPUT ELEMENT
2, 102 FIRST ELECTRODE
3, 103 SECOND ELECTRODE
4, 104 INTERMEDIATE LAYER
5 INPUT DEVICE
6 DISPLAY ELEMENT
8 SIGNAL PROCESSOR
8A POSITION DETECTOR
8B FORCE DETECTOR
23, 107 SPACER
105 HEATPROOF LAYER

CITATION LIST

Patent Literature

Patent Literature 1: Japanese Patent No. 4784041
Patent Literature 2: Japanese Patent Application Laid-open No. 2014-186711

The invention claimed is:
1. An input element, comprising:
a first electrode and a second electrode that face each other; and
an intermediate layer disposed between the first and the second electrodes and made of rubber or a rubber composition, the rubber or rubber composition containing siloxane and having insulation properties,
wherein the intermediate layer has concentration profiles such that, while oxygen increases to a maximal value from a first side to a second side of a thickness direction, carbon decreases to a minimal value from the first side to the second side of the thickness direction, the first side facing the first electrode and the second side facing the second electrode, wherein the first side of the intermediate layer and the second side of the intermediate layer have different deformation amounts when a force is applied to the intermediate layer from a direction perpendicular to a plane of the intermediate layer, wherein a universal hardness with an indentation depth of 10 μm in the first side of the intermediate layer is different from a universal hardness with an indentation of depth of 10 μm in the second side of the intermediate layer, wherein the intermediate layer has a single layer structure, and wherein a ratio of the universal hardness in the first side of the intermediate layer to the universal hardness in the second side of the intermediate layer is 1.01 or more.

2. The input element according to claim 1, further comprising:

a heat-resisting layer disposed between at least one of the first and the second electrodes and the intermediate layer.

3. The input element according to claim 2, wherein the heat-resisting layer is made of a thermosetting material or a thermoplastic material and has a capability to serve as a bonding layer.

4. The input element according to claim 3, wherein the heat-resisting layer is made of a material having a thermal property that is the same as or equivalent to thermal property of the intermediate layer.

5. The input element according to claim 1, wherein the intermediate layer is made of rubber or a rubber composition, the rubber or rubber composition containing siloxane that has a silicon atom bound to three to four oxygen atoms.

6. The input element according to claim 1, wherein a part of the intermediate layer and a part of at least one of the first and the second electrodes are not joined to each other.

7. The input element according to claim 6, further comprising a spacer between the intermediate layer and at least one of the first and the second electrodes.

8. The input element according to claim 1, wherein the first electrode includes a plurality of electrodes arrayed along a first direction, and the second electrode includes a plurality of electrodes arrayed along a second direction perpendicular to the first direction.

9. An input device, comprising:

the input element according to claim 1; and a signal processor configured to process an electric signal generated as a result of having the intermediate layer pressed.

10. The input element according to claim 1, further comprising:

a heat-resisting layer disposed or on one side of at least one of the first and the second electrodes, the one side facing away from the intermediate layer.

11. The input element according to claim 10, wherein the heat-resisting layer is made of a thermosetting material or a thermoplastic material and has a capability to serve as a bonding layer.

12. The input element according to claim 11, wherein the heat-resisting layer is made of a material having a thermal property that is the same as or equivalent to thermal property of the intermediate layer.

13. The input element according to claim 1, wherein the intermediate layer is not bonded to at least one of the first electrode and the second electrode.

14. The input element according to claim 1, wherein the ratio of the universal hardness in the first side of the intermediate layer to the universal hardness in the second side of the intermediate layer is 1.70 or less.

* * * * *